(12) United States Patent
Hanagata

(10) Patent No.: US 11,322,585 B2
(45) Date of Patent: May 3, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shoko Hanagata, Komatsu Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 66 days.

(21) Appl. No.: 17/007,240

(22) Filed: Aug. 31, 2020

(65) Prior Publication Data

US 2021/0288142 A1  Sep. 16, 2021

(30) Foreign Application Priority Data

Mar. 10, 2020  (JP) .............................. JP2020-041043

(51) Int. Cl.
*H01L 29/06* (2006.01)
*H01L 29/739* (2006.01)
*H01L 29/861* (2006.01)

(52) U.S. Cl.
CPC ...... *H01L 29/0692* (2013.01); *H01L 29/7397* (2013.01); *H01L 29/861* (2013.01)

(58) Field of Classification Search
CPC ............. H01L 29/0692; H01L 29/7397; H01L 29/861

USPC .......................................................... 257/139
See application file for complete search history.

(56) References Cited

U.S. PATENT DOCUMENTS

| 9,391,070 B2 | 7/2016 | Matsuda et al. |
| 9,455,355 B2 | 9/2016 | Otsuki et al. |
| 2015/0200247 A1* | 7/2015 | Schmidt ................ H01L 21/324 257/140 |
| 2016/0247808 A1* | 8/2016 | Horiuchi ................. H01L 29/78 |
| 2018/0233554 A1 | 8/2018 | Mitsuzuka et al. |
| 2020/0091141 A1* | 3/2020 | Itakura .................. H01L 23/051 |

FOREIGN PATENT DOCUMENTS

JP  2016-058654 A  4/2016

* cited by examiner

*Primary Examiner* — Igwe U Anya
(74) *Attorney, Agent, or Firm* — Kim & Stewart LLP

(57) ABSTRACT

A semiconductor device includes a semiconductor layer. The semiconductor layer has bottom and upper surfaces opposite to each other in a first direction. The semiconductor layer includes a first region of a first conductivity type at the bottom surface, a second region of the first conductivity type at the bottom surface surrounding the first region, a third region of the first conductivity type above the first and second regions, and a fourth region of a second conductivity type extending from the upper surface into the third region. In a first cross sectional plane along the first direction, an outer edge of the first region is within an outer edge of the fourth region by a first distance. In a second cross sectional plane along the first direction, an outer edge of the first region is within an outer edge of the fourth region by a second distance.

20 Claims, 19 Drawing Sheets

FIG. 3
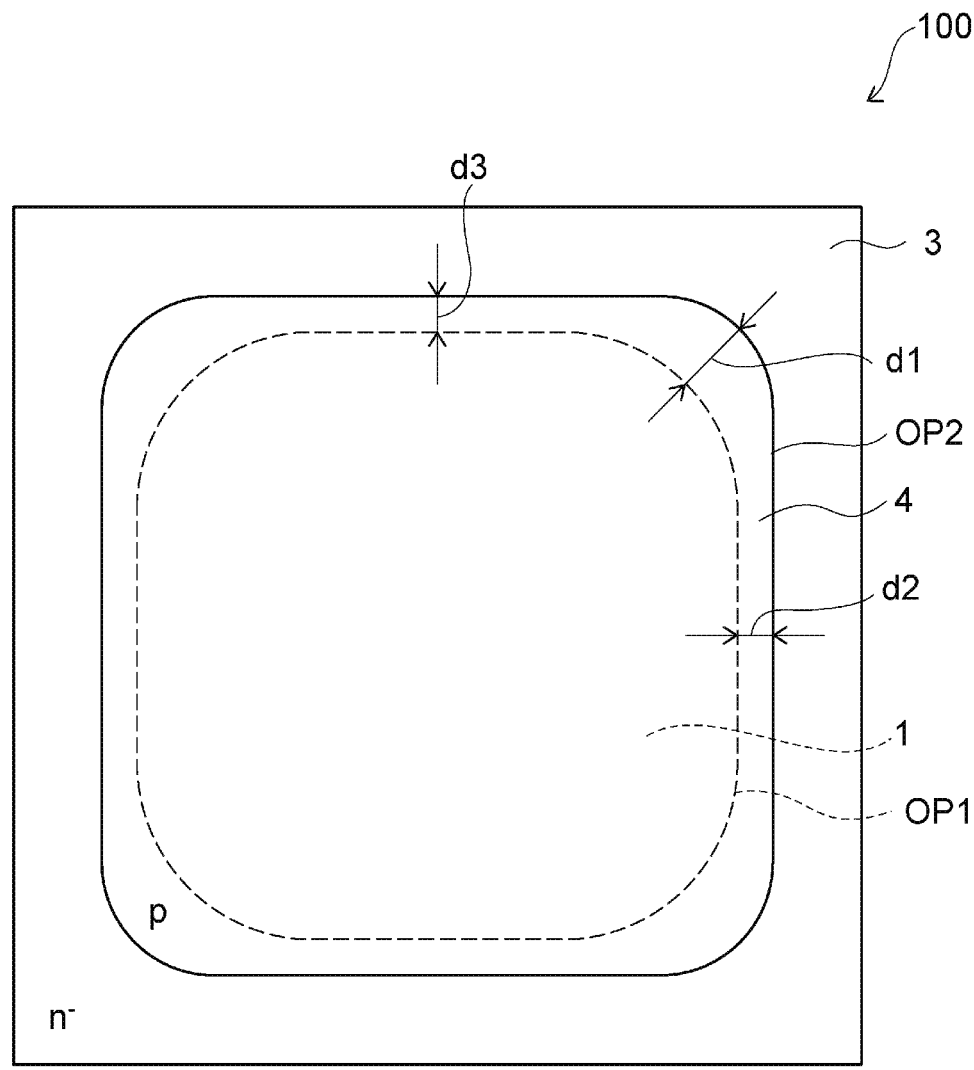
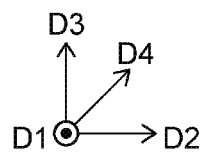

FIG. 14
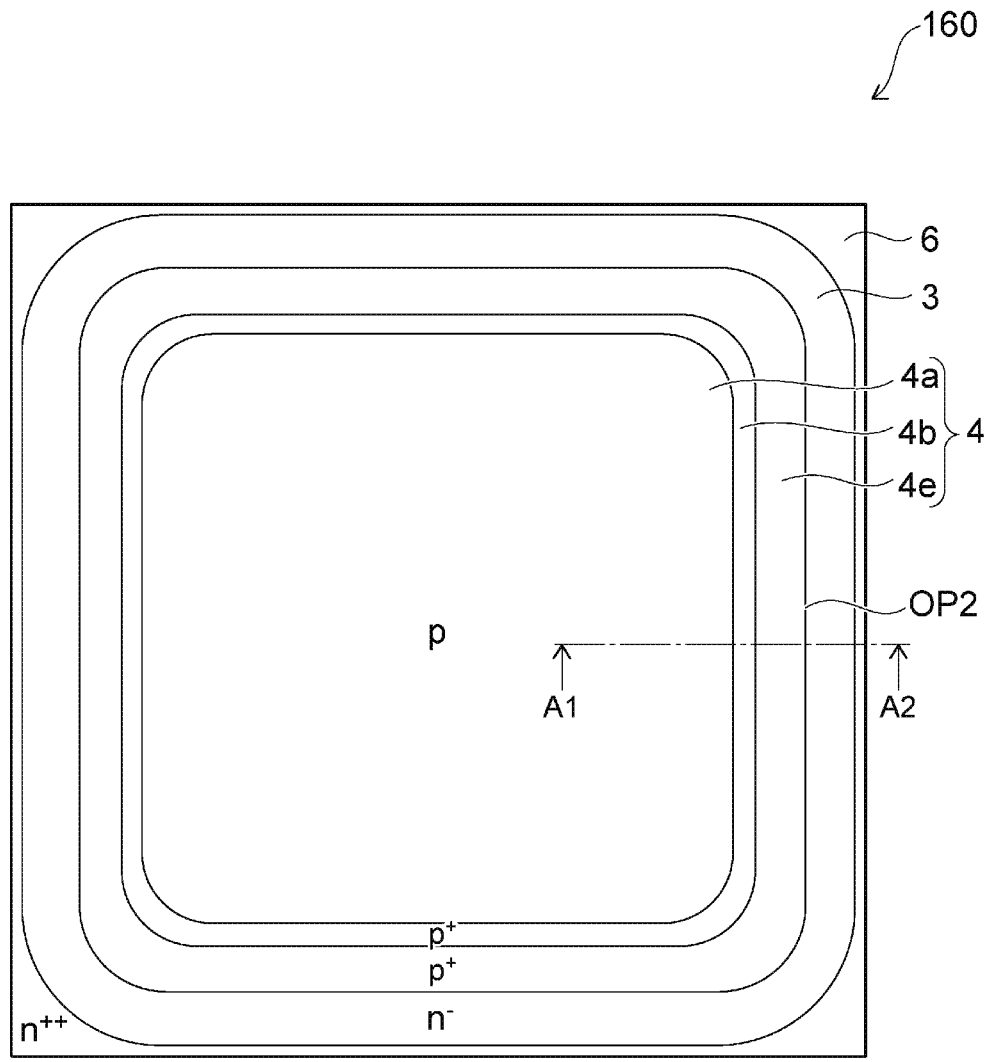
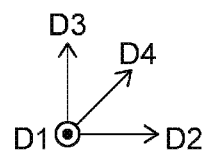

FIG. 16
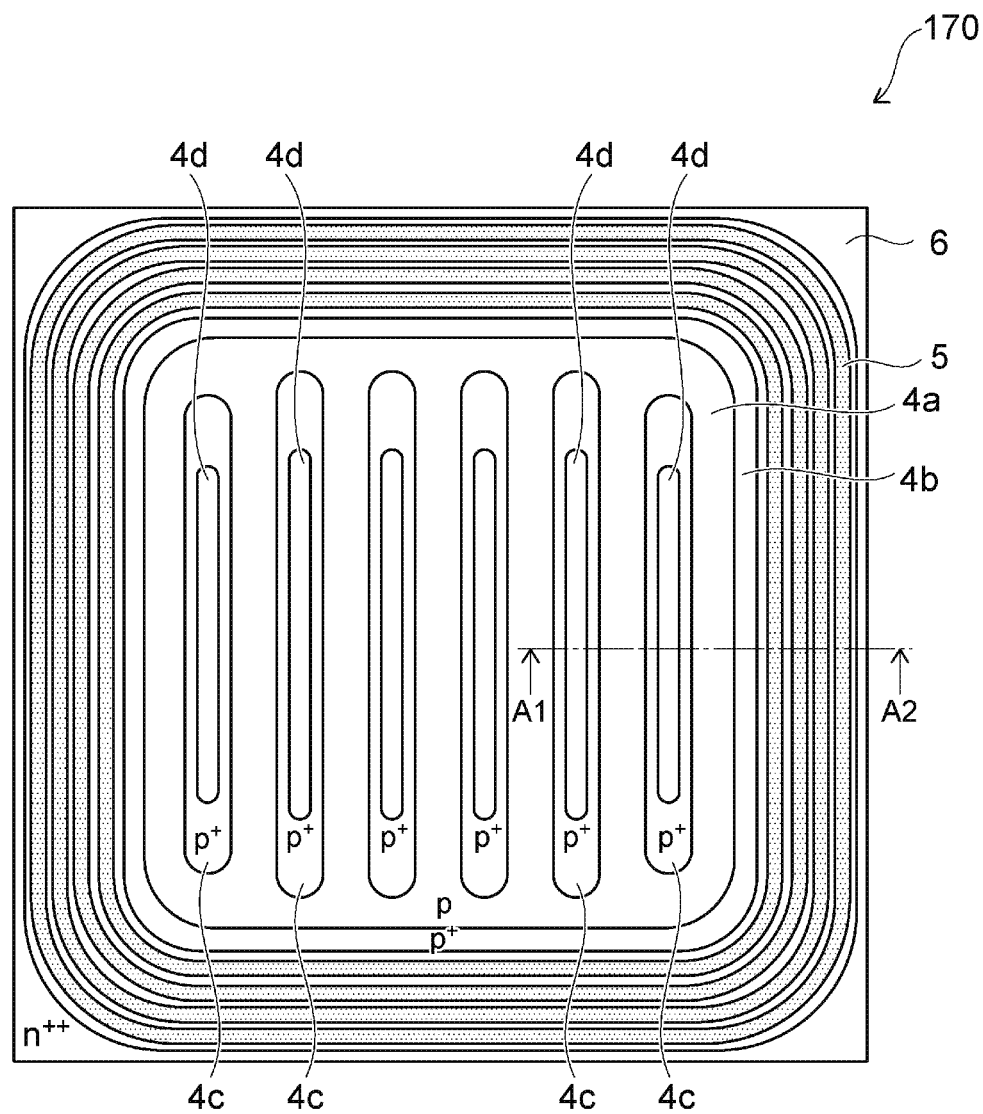
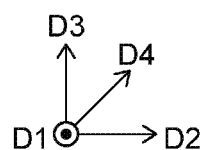

SEMICONDUCTOR DEVICE

CROSS-REFERENCE TO RELATED APPLICATION(S)

This application is based upon and claims the benefit of priority from Japanese Patent Application No. 2020-041043, filed on Mar. 10, 2020, the entire contents of which are incorporated herein by reference.

FIELD

Embodiments described herein relate generally to a semiconductor device.

BACKGROUND

Semiconductor devices such as diodes are used for applications such as power conversion. There is a demand for technology that can reduce breakage of semiconductor devices when current flow is interrupted.

BRIEF DESCRIPTION OF THE DRAWINGS

FIG. 3 is another plan view of the semiconductor device according to the first embodiment.

FIG. 14 is a plan view of a semiconductor device according to a sixth modification example of the first embodiment.

FIG. 16 is a plan view of a semiconductor device according to a seventh modification example of the first embodiment.

DETAILED DESCRIPTION

Figure 1:
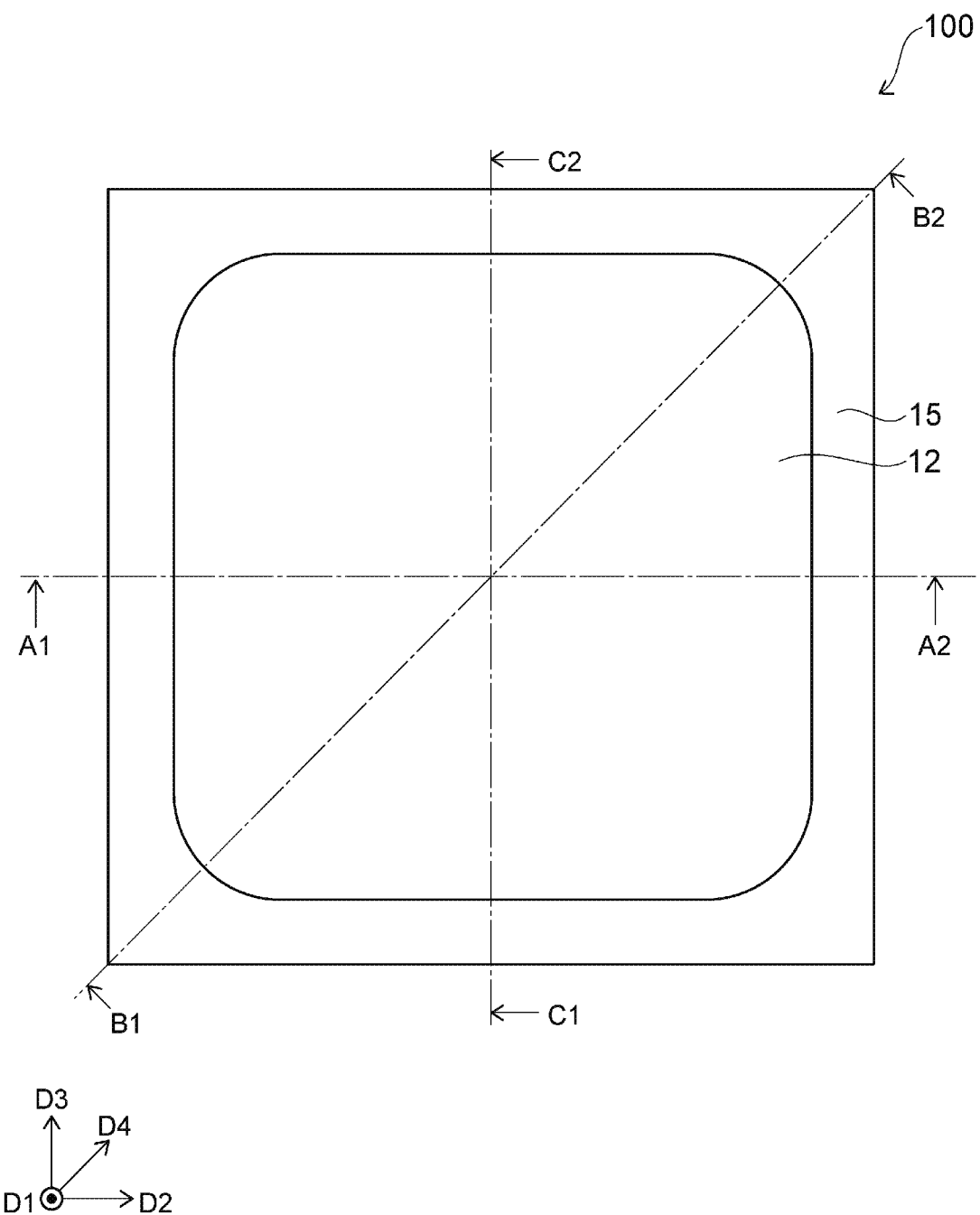
FIG. 1 is a plan view of a semiconductor device according to a first embodiment.

Certain example embodiments provide a semiconductor device that can reduce the likeliness of breakage of a semiconductor device when current flow is interrupted.

In general, according to an embodiment, a semiconductor device includes a semiconductor layer, a first electrode, and a second electrode. The semiconductor layer has bottom and upper surfaces opposite to each other in a first direction. The semiconductor layer includes a first region of a first conductivity type at the bottom surface, a second region of the first conductivity type at the bottom surface surrounding the first region, a third region of the first conductivity type above the first and second regions, and a fourth region of a second conductivity type extending from the upper surface into the third region. The second region has a lower impurity concentration of the first conductivity type than the first region. The third region having a lower impurity concentration of the first conductivity type than the second region. The first electrode is on the bottom surface and contacts the first and second regions. The second electrode is on the upper surface and contacting the fourth region. In a first cross sectional plane along the first direction, an outer edge of the first region is positioned inside of an outer edge of the fourth region by a first distance. In a second cross sectional plane along the first direction, an outer edge of the first region is positioned inside of an outer edge of the fourth region by a second distance less than the first distance.

Hereinafter, example embodiments of the present disclosure will be described with reference to the drawings.

The drawings are schematic or conceptual, and the relationship between the thickness and width of each portion, the size ratio between the portions, and the like are not always the same as the actual ones. Even when the same portion is depicted in different drawings, the dimensions and ratios may be different depending on the drawings.

In the present specification and the drawings, elements similar to those already described are denoted by the same reference numerals and detailed description thereof may be appropriately omitted.

In the following description and drawings, the notation of $n^{++}$, n, $n^-$, $p^{++}$, $p^+$, and p represents the relative level of each impurity concentration. That is, the notation with "++" indicates that the impurity concentration is relatively higher than the notation with "+". The notation with "+" indicates that the impurity concentration is relatively higher than the notation without "+" or with "−". The notation with "−" indicates that the impurity concentration is relatively lower than the other notations. These notations represent the relative amount of a net impurity concentration after the impurities have compensated for each other when each region contains both p type impurities and n type impurities.

With respect to each embodiment described below, each embodiment may be implemented by inverting the n type (an example of a first conductivity type) and the p type (an example of a second conductivity type) of each semiconductor region.

First Embodiment

FIGS. 1 and 3 are plan views of a semiconductor device according to a first embodiment.

Figure 2:
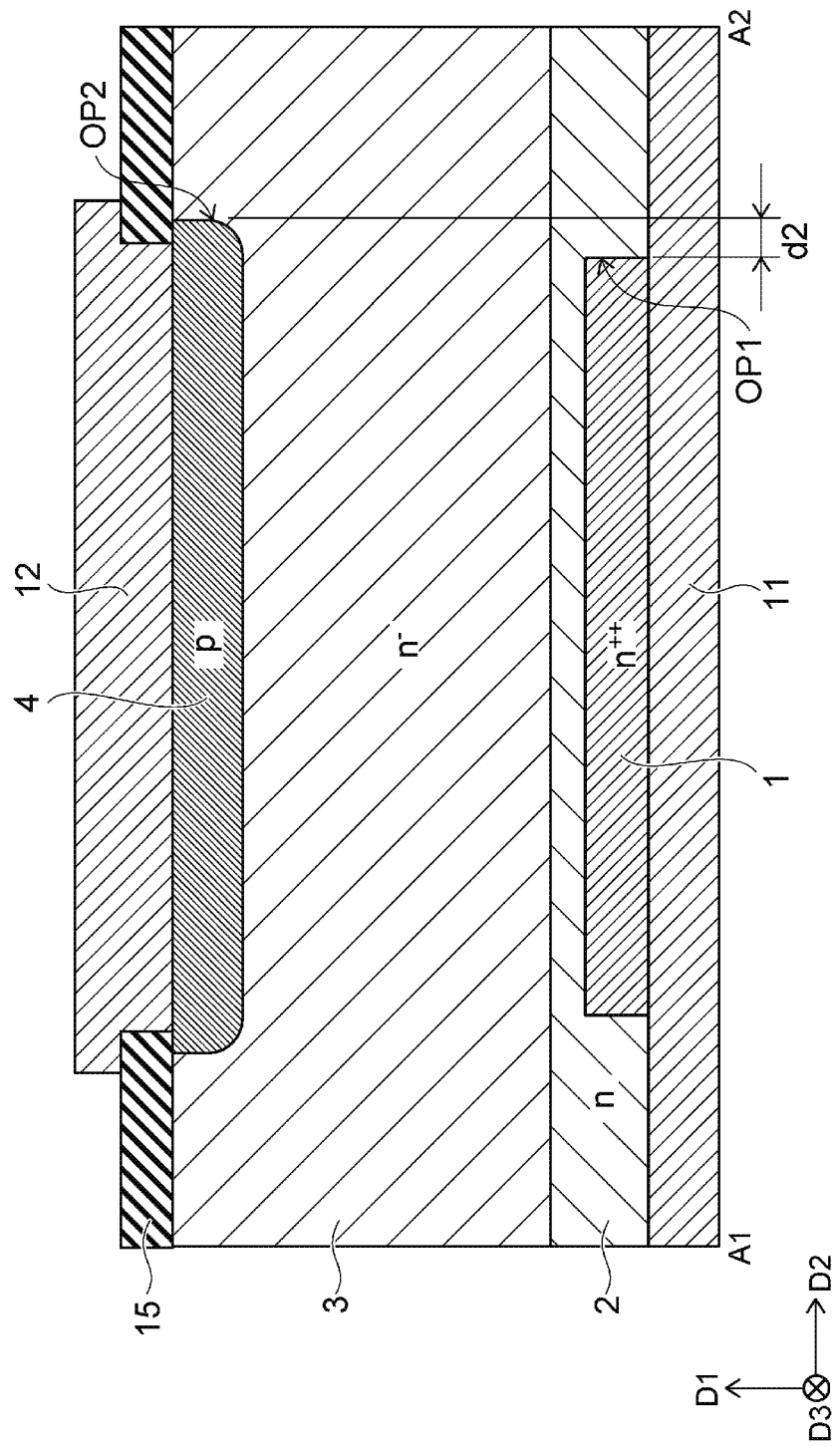
FIG. 2 is a cross sectional view taken along a line A1-A2 in FIG. 1.
Figure 4:
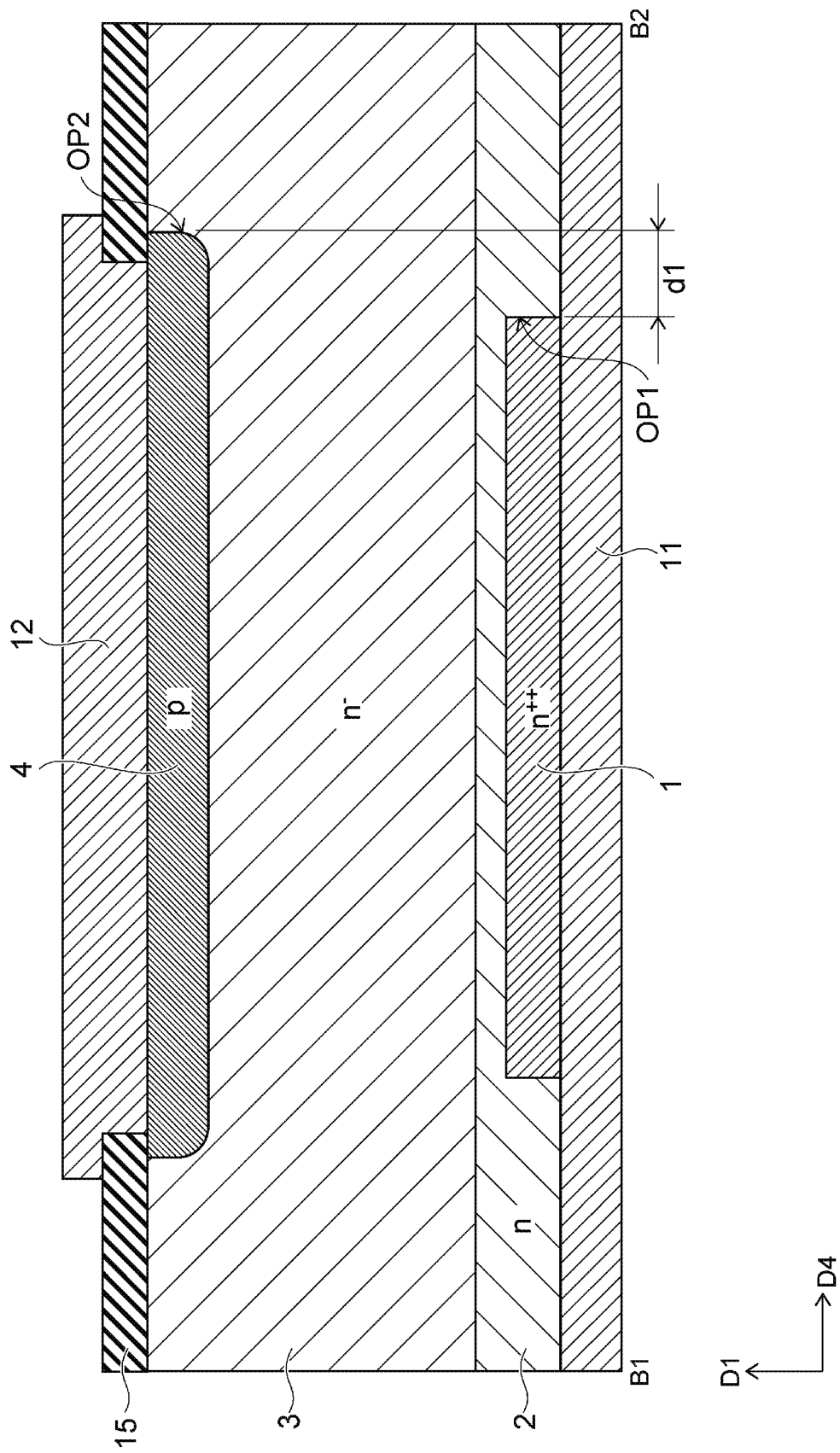
FIG. 4 is a cross sectional view taken along a line B1-B2 in FIG. 1.

FIG. 2 is a cross sectional view of the semiconductor device taken along a line A1-A2 in FIG. 1. FIG. 4 is a cross sectional view of the semiconductor device taken along a line B1-B2 in FIG. 1.

A semiconductor device 100 according to the first embodiment shown in FIGS. 1 to 4 is a diode. The semiconductor device 100 includes an $n^{++}$ type cathode region 1 (a first semiconductor region), an n type buffer region 2 (a second semiconductor region), an $n^-$ type drift region 3 (a third semiconductor region), an anode region 4 (a fourth semiconductor region), a first electrode 11, a second electrode 12, and an insulating layer 15. In FIG. 3, the second electrode 12 and the insulating layer 15 are omitted, and the $n^{++}$ type cathode region 1 is shown with a broken line.

Here, a direction from the first electrode 11 to the $n^{++}$ type cathode region 1 becomes a first direction D1. Two directions which are perpendicular in relation to the first direction D1 and are orthogonal to each other are referred to as a second direction D2 and a third direction D3. For description, a direction from the first electrode 11 to the $n^{++}$ type cathode region 1 is referred to as "upper", and an opposite direction thereof is referred to as "lower". These directions are based on the relative positional relationship between the first electrode 11 and the $n^{++}$ type cathode region 1 and are independent of the direction of gravity.

As shown in FIG. 1, the second electrode 12 is provided at an upper surface of the semiconductor device 100. The insulating layer 15 is provided around the second electrode 12 along a plane defined by the second direction D2 and the third direction D3.

As shown in FIG. 2, the first electrode 11 is provided on a lower surface of the semiconductor device 100. The $n^{++}$ type cathode region 1 is provided on the first electrode 11. For example, the $n^{++}$ type cathode region 1 is provided on the first electrode 11 in the center in the second direction D2 and the third direction D3. The $n^{++}$ type cathode region 1 is electrically connected to the first electrode 11.

The n type buffer region 2 is provided on the $n^{++}$ type cathode region 1 and surrounding the $n^{++}$ type cathode region 1. The $n^-$ type drift region 3 is provided on the $n^{++}$ type cathode region 1 and the n type buffer region 2. Specifically, a portion of the n type buffer region 2 is provided surrounding the $n^{++}$ type cathode region 1 along a plane defined by the second direction D2 and the third direction D3. Another portion of the n type buffer region 2 is provided between the $n^{++}$ type cathode region 1 and the $n^-$ type drift region 3 in the first direction D1.

The n type impurity concentration in the n type buffer region 2 is lower than the n type impurity concentration in the $n^{++}$ type cathode region 1. The n type impurity concentration in the $n^-$ type drift region 3 is lower than the n type impurity concentration in the n type buffer region 2.

The anode region 4 is a second conductivity type semiconductor region. The anode region 4 is provided on the $n^-$ type drift region 3. At least a portion of the anode region 4 is positioned on the $n^{++}$ type cathode region 1. A portion of the $n^-$ type drift region 3 is provided along a plane defined by the second direction D2 and the third direction D3 to surround the anode region 4. The p type impurity concentration in the anode region 4 is higher than the n type impurity concentration in the $n^-$ type drift region 3.

The second electrode 12 is provided on the anode region 4 and electrically connected to the anode region 4. The upper surface of the $n^-$ type drift region 3 is around the anode region 4 and is covered with the insulating layer 15.

The structure in the C1-C2 cross section shown in FIG. 1 is, for example, substantially the same as the structure in the A1-A2 cross section shown in FIG. 2.

FIG. 3 shows a positional relationship between the $n^{++}$ type cathode region 1 and the anode region 4 when viewed from the first direction D1. In FIG. 3, the $n^{++}$ type cathode region 1 is shown with a broken line. As shown in FIG. 3, a first outer edge OP1 of the $n^{++}$ type cathode region 1 is positioned more to the inner side than a second outer edge OP2 of the anode region 4.

In the semiconductor device 100, a distance d1 (first distance) between the first outer edge OP1 and the second outer edge OP2 in a fourth direction D4 in a first cross section along the first direction D1 and the fourth direction D4 is longer than a distance d2 (second distance) between the first outer edge OP1 and the second outer edge OP2 in the second direction D2 in a second cross section along the first direction D1 and the second direction D2. The fourth direction D4 is perpendicular to the first direction D1 and intersects the second direction D2 and the third direction D3.

For example, the first cross section corresponds to the B1-B2 cross section shown in FIG. 4. The second cross section corresponds to the A1-A2 cross section shown in FIG. 2. The first cross section and the second cross section pass through the center of the $n^{++}$ type cathode region 1 in the second direction D2 and the third direction D3.

As shown in FIG. 3, the distance d1 is longer than a distance d3 between the first outer edge OP1 and the second outer edge OP2 in the third direction D3 in a third cross section along the first direction D1 and the third direction D3. For example, the third cross section corresponds to the C1-C2 cross section of FIG. 2. The third cross section passes through the center of the $n^{++}$ type cathode region 1 in the second direction D2 and the third direction D3.

For example, as shown in FIG. 3, the $n^{++}$ type cathode region 1 and the anode region 4 have a quadrangular shape when viewed from the first direction D1. The second direction D2 and the third direction D3 are along sides of the $n^{++}$ type cathode region 1 and the anode region 4. The fourth direction D4 is along a diagonal line of the $n^{++}$ type cathode region 1 and the anode region 4. When viewed from the first direction D1, the $n^{++}$ type cathode region 1 is farther from the anode region 4 in a diagonal line direction than in a side direction.

Examples of a material of each component of the semiconductor device 100 are described.

The $n^{++}$ type cathode region 1, the n type buffer region 2, the $n^-$ type drift region 3, and the anode region 4 include silicon, silicon carbide, gallium nitride, or gallium arsenide as a semiconductor material. When silicon is used as the semiconductor material, arsenic, phosphorus, or antimony may be used as the n type impurity. Boron may be used as the p type impurity.

The first electrode 11 and the second electrode 12 include a metal such as aluminum. The insulating layer 15 includes an insulating material such as silicon oxide or silicon nitride.

The operation of the semiconductor device 100 is described.

When a positive voltage is applied to the second electrode 12 in relation to the first electrode 11, a forward voltage is applied to a pn junction surface between the $n^-$ type drift region 3 and the anode region 4. Holes are injected from the anode region 4 to the $n^-$ type drift region 3, and electrons are injected from the $n^{++}$ type cathode region 1 to the $n^-$ type drift region 3. A current flows from the second electrode 12 to the first electrode 11, and the semiconductor device 100 goes into an on state. In the on state, holes and electrons are accumulated in the $n^-$ type drift region 3, and the electrical resistance of the $n^-$ type drift region 3 is greatly reduced.

Thereafter, when a positive voltage is applied to the first electrode 11 in relation to the second electrode 12, the current flowing from the second electrode 12 to the first electrode 11 is interrupted and the semiconductor device 100 goes into an off state. The holes accumulated in the $n^-$ type drift region 3 are discharged to the second electrode 12 through the anode region 4. The accumulated electrons are discharged to the first electrode 11 through the $n^{++}$ type cathode region 1. A depletion layer spreads from the pn junction surface between the $n^-$ type drift region 3 and the anode region 4 to the n⁻ type drift region 3 according to the voltage. The breakdown voltage is maintained by the depletion layer spreading to the n⁻ type drift region 3.

The n type impurity concentration in the n type buffer region 2 is higher than the n type impurity concentration in the n⁻ type drift region 3. Therefore, the depletion layer spreads along the entire n⁻ type drift region 3 in the first direction D1. When the depletion layer reaches the n type buffer region 2, the spreading of the depletion layer is prevented. Therefore, the reaching of the depletion layer in the n⁺⁺ type cathode region 1 can be prevented. The n type buffer region 2 is provided on the n⁺⁺ type cathode region 1 and around the n⁺⁺ type cathode region 1. Therefore, in the center portion and the outer peripheral portion of the semiconductor device 100, reaching of the depletion layer in the n⁺⁺ type cathode region 1 can be prevented.

The effect of the first embodiment is described.

Figure 5:
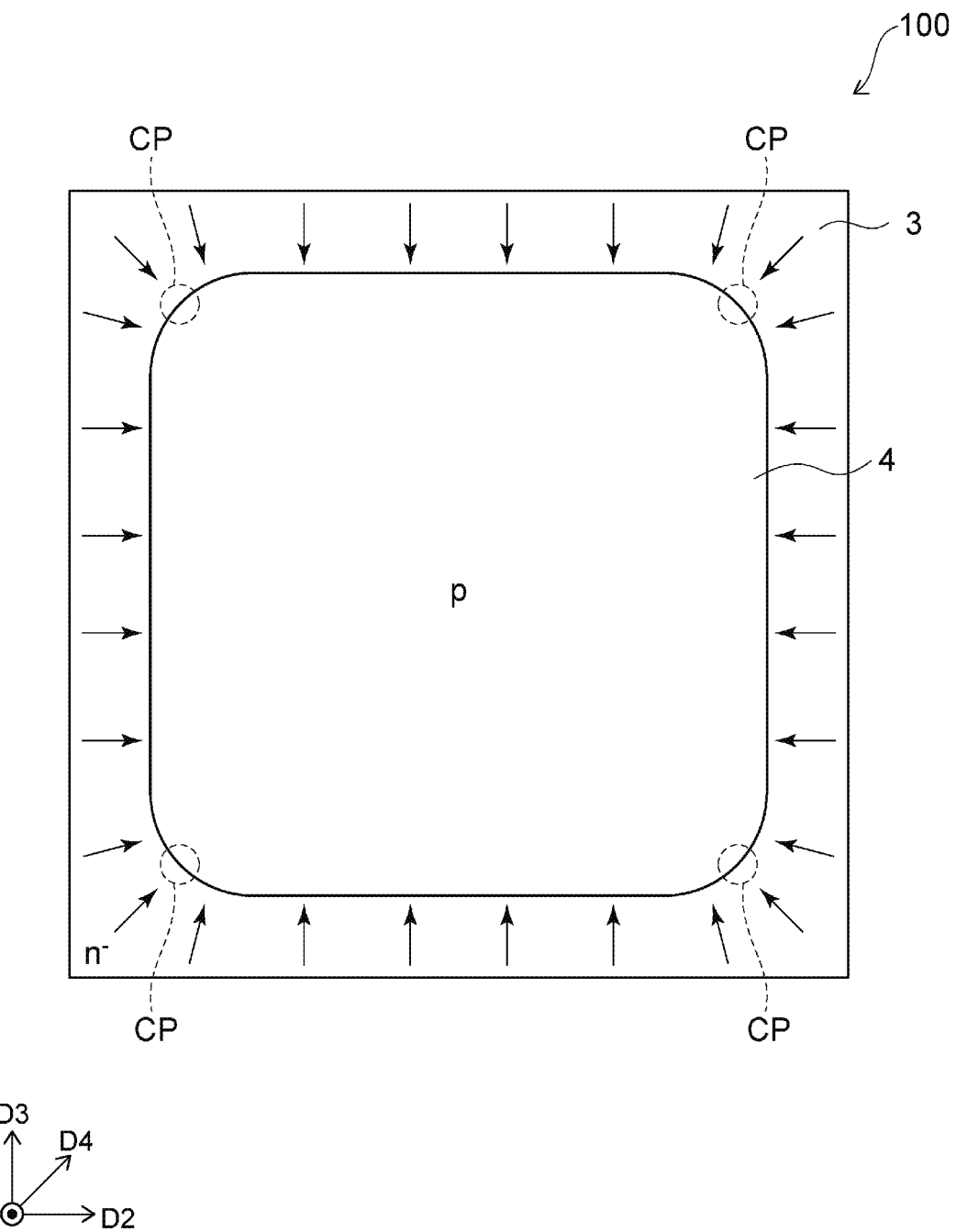
FIG. 5 is a schematic diagram depicting a flow of carriers in a semiconductor device according to a first embodiment.

FIG. 5 is a schematic diagram showing a flow of carriers in the semiconductor device according to the first embodiment.

As described above, in the semiconductor device 100, when the current flow is interrupted, the holes and the electrons accumulated in the n⁻ type drift region 3 are discharged. The holes accumulated in the n⁻ type drift region 3 around the anode region 4 move to the anode region 4 as indicated by arrows in FIG. 5 and are discharged from the second electrode 12 through the anode region 4. At this point, more holes flow into an end portion (a corner portion CP) of the anode region 4 in the fourth direction D4 compared with other portions. As a result, in the corner portion of the anode region 4, the current concentrates, and thus it is likely that the semiconductor device 100 will breakdown.

In the first embodiment, as shown in FIGS. 2 to 4, the distance d1 between the first outer edge OP1 and the second outer edge OP2 in the first cross section is longer than the distance d2 between the first outer edge OP1 and the second outer edge OP2 in the second cross section. Since the distance d1 is longer than the distance d2, compared with a case where the distance d1 is the same as the distance d2, when the semiconductor device 100 goes into an on state, the injection of electrons from the n⁺⁺ type cathode region 1 to the n⁻ type drift region 3 near the corner portion CP can be prevented. By preventing the injection of the electrons, the injection of the holes from the anode region 4 to the n⁻ type drift region 3 near the corner portion CP is prevented. Since the injection of the holes to the n⁻ type drift region 3 near the corner portion CP is prevented, the semiconductor device 100 goes into an off state, an amount of the holes that flow into the corner portion CP decreases. As a result, at the time of the interruption of the current, the concentration of the current in the corner portion CP of the semiconductor device 100 is prevented, and the likeliness of the breakage of the semiconductor device 100 can be reduced. In the same manner, the likeliness of the breakage of the semiconductor device 100 can be reduced by causing the distance d1 to be longer than the distance d3.

In the following, an example of a specific structure of the semiconductor device 100 is described.

The semiconductor device 100 is, for example, a quadrangular shape as shown in FIG. 1. The length in the fourth direction D4 of the semiconductor device 100 is longer than the lengths of the semiconductor device 100 in the second direction D2 and the third direction D3, respectively. In the same manner, as shown in FIG. 3, the length of the n⁺⁺ type cathode region 1 in the fourth direction D4 is longer than the lengths of the n⁺⁺ type cathode region 1 in the second direction D2 and the third direction D3, respectively. The length of the anode region 4 in the fourth direction D4 is longer than the lengths of the anode region 4 in the second direction D2 and the third direction D3, respectively.

For example, the distance d1 may be 20 μm to 200 μm. The distance d2 may be 0 μm to 200 μm. The distance d3 may be 0 μm to 200 μm. More specifically, the distance d1 may be 50 μm to 100 μm. The distance d2 may be 0 μm to 100 μm. The distance d3 may be 0 μm to 100 μm. When the distance d2 is 0 μm, in the second cross section, the first outer edge OP1 is aligned with the second outer edge OP2 in the first direction D1. When the distance d3 is 0 μm, in the third cross section, the first outer edge OP1 is aligned with the second outer edge OP2 in the first direction D1.

As the distance d1 becomes longer than the distance d2, the concentration of the current in the corner portion CP can be prevented. If the distance d1 is too long, injection of the electrons from the n⁺⁺ type cathode region 1 to the n⁻ type drift region 3 excessively decreases when the semiconductor device 100 goes into an on state. If the injection of the electrons is decreased too much, the on-state resistance of the semiconductor device 100 excessively increases. In view of this, the difference between the distance d1 and the distance d2 is preferably 50 μm to 200 μm. The difference between the distance d1 and the distance d3 is preferably 50 μm to 200 μm. When the distance d2 or d3 is longer than 0 μm, the distance d1 is preferably 1.1 times to 200 times of the distance d2 or d3.

First Modification Example

Figure 6:
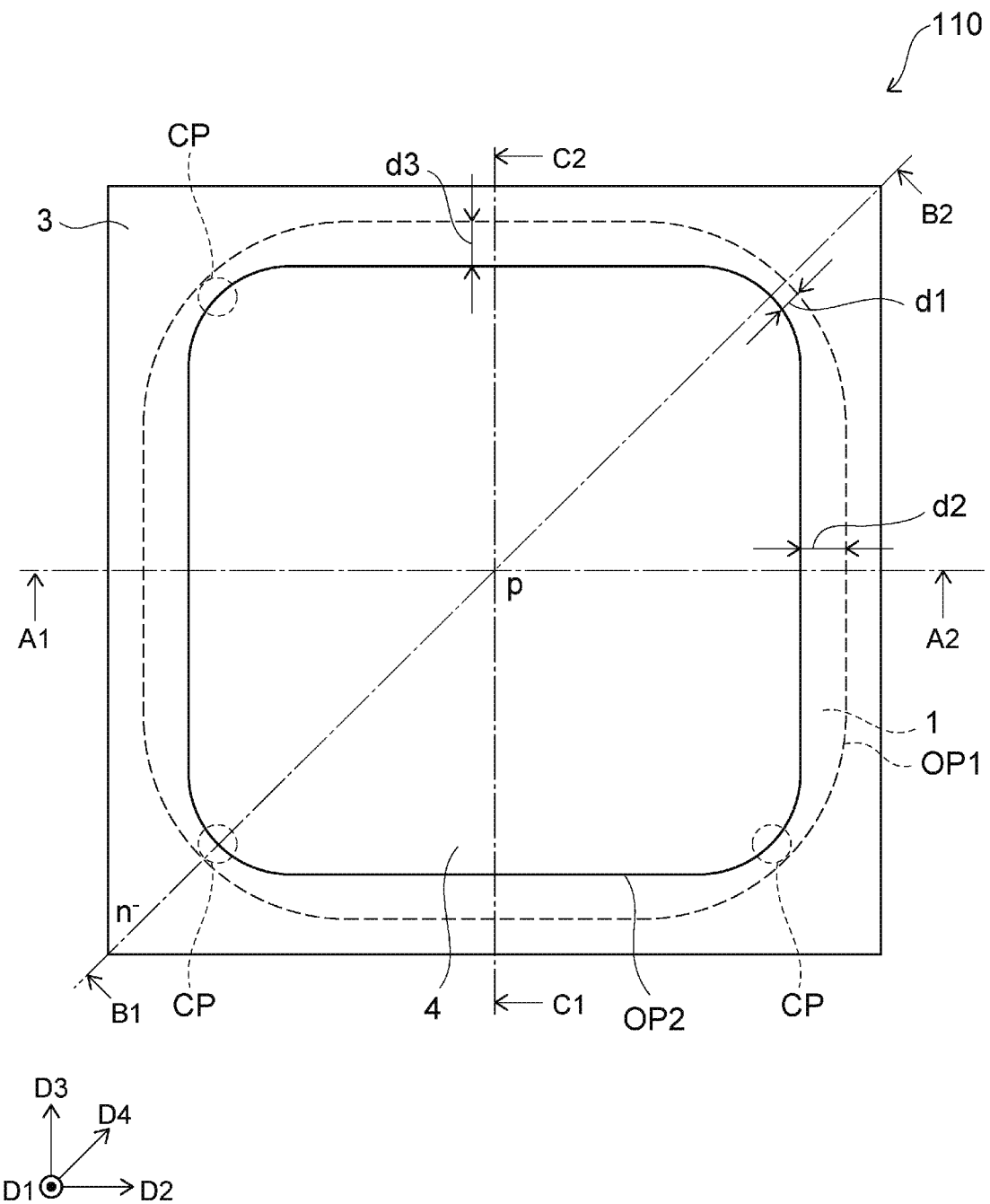
FIG. 6 is a plan view of a semiconductor device according to a first modification example of the first embodiment.

FIG. 6 is a plan view of a semiconductor device according to a first modification example of the first embodiment. In FIG. 6, the second electrode 12 and the insulating layer 15 are omitted.

In a semiconductor device 110 according to the first modification example, when viewed from the first direction D1, the first outer edge OP1 of the n⁺⁺ type cathode region 1 is positioned outside of the second outer edge OP2 of the anode region 4. The same structure as in the semiconductor device 100 is applicable to other structures of the semiconductor device 110.

Specifically, the distance d1 between the first outer edge OP1 and the second outer edge OP2 in the fourth direction D4 in the first cross section is shorter than the distance d2 between the first outer edge OP1 and the second outer edge OP2 in the second direction D2 in the second cross section. The distance d1 is shorter than the distance d3 between the first outer edge OP1 and the second outer edge OP2 in the third direction D3 in the third cross section. When viewed from the first direction D1, the n⁺⁺ type cathode region 1 is closer to the anode region 4 than in the side direction in the diagonal line direction.

For example, the first cross section corresponds to the B1-B2 cross section of FIG. 6. The second cross section corresponds to the A1-A2 cross section of FIG. 6. The third cross section corresponds to the C1-C2 cross section of FIG. 6.

By causing the distance d1 to be shorter than the distance d2, compared with a case where the distance d1 is the same as the distance d2, when the semiconductor device 110 goes into an on state, the injection of holes and electrons from the anode region 4 to the n⁻ type drift region 3 near the corner portion CP can be prevented. According to the first modification example, when the first outer edge OP1 is positioned more to an outer side than the second outer edge OP2, the likeliness of the breakage of the semiconductor device 110 can be reduced.

For example, the distance d1 may be 0 μm to 100 μm. The distance d2 may be 0 μm to 200 μm. The distance d3 may be 0 μm to 200 μm. More preferably, the distance d1 is 0 μm to 50 μm. The distance d2 is 0 μm to 100 μm. The distance d3 is 0 μm to 100 μm. When the distance d1 is 0 μm, in the first cross section, the first outer edge OP1 is aligned with the second outer edge OP2 in the first direction D1.

In view of the prevention of the concentration of the current in the corner portion CP and the on-state resistance of the semiconductor device 110, the difference between the distance d1 and the distance d2 is preferably 50 μm to 200 μm. The difference of the distance d1 and the distance d3 is preferably 50 μm to 200 μm. When the distance d1 is longer than 0 μm, the distance d2 or d3 is preferably 1.1 times to 200 times of the distance d1.

Second Modification Example

Figure 7:
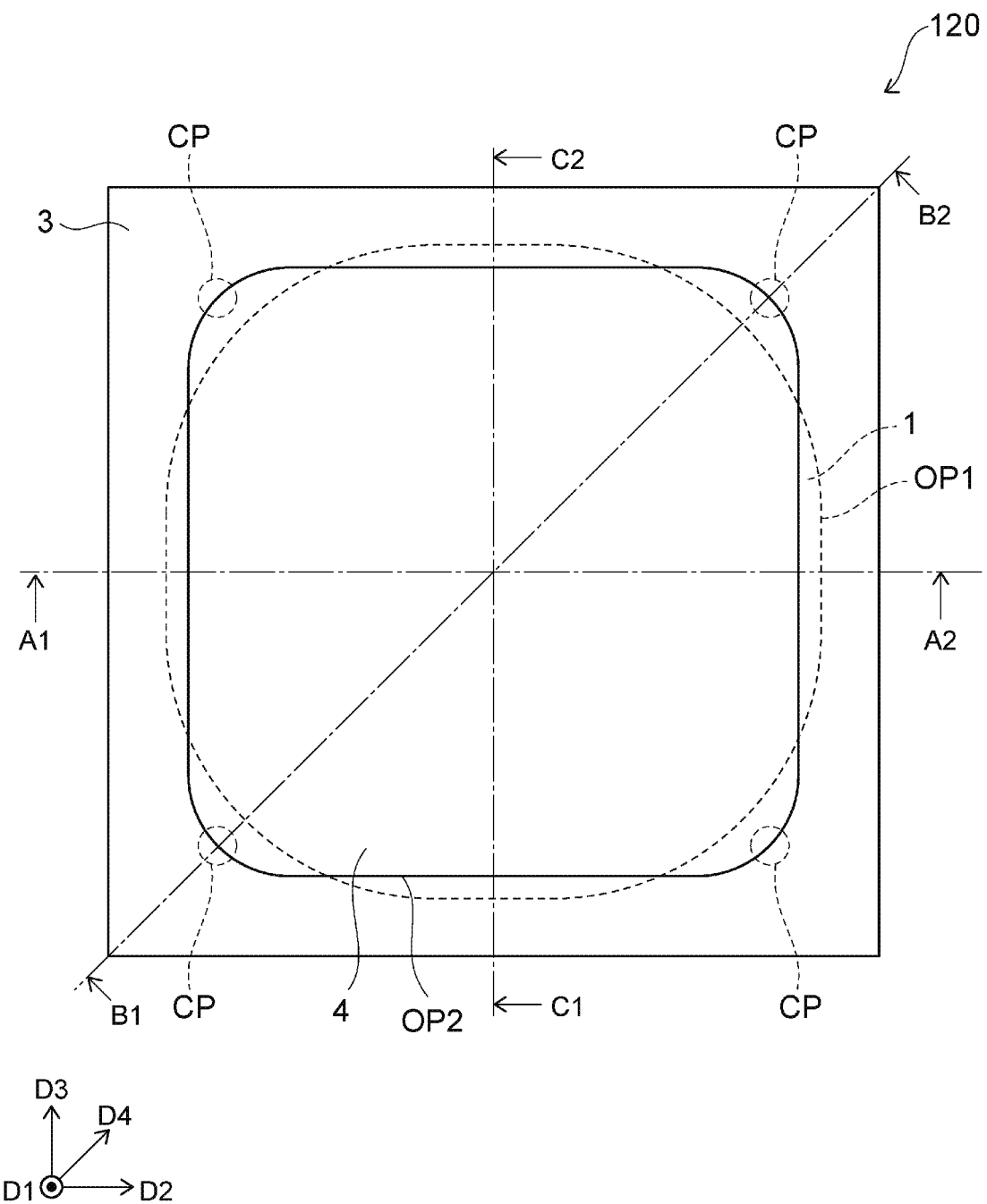
FIG. 7 is a plan view of a semiconductor device according to a second modification example of the first embodiment.

FIG. 7 is a plan view of a semiconductor device according to a second modification example of the first embodiment. In FIG. 7, the second electrode 12 and the insulating layer 15 are omitted.

In a semiconductor device 120 according to the second modification example, the length of the anode region 4 in the second direction D2 is shorter than the length of the $n^{++}$ type cathode region 1 in the second direction D2. The length of the anode region 4 in the third direction D3 is shorter than the length of the $n^{++}$ type cathode region 1 in the third direction D3. The length of the anode region 4 in the fourth direction D4 is longer than the length of the $n^{++}$ type cathode region 1 in the fourth direction D4.

In the first cross section, the first outer edge OP1 of the $n^{++}$ type cathode region 1 is positioned more to an inner side than the second outer edge OP2 of the anode region 4. For example, in the first cross section, the position of the first outer edge OP1 in the fourth direction D4 is between the position of the second outer edge OP2 in the fourth direction D4 and the center of the semiconductor device 100 in the fourth direction D4. In the second cross section, the first outer edge OP1 of the $n^{++}$ type cathode region 1 is positioned more to the outer side than the second outer edge OP2 of the anode region 4. For example, in the second cross section, the position of the second outer edge OP2 in the second direction D2 is between the position of the first outer edge OP1 in the second direction D2 and the center of the semiconductor device 100 in the second direction D2. In the third cross section, the first outer edge OP1 of the $n^{++}$ type cathode region 1 is positioned outside of the second outer edge OP2 of the anode region 4. For example, in the third cross section, the position of the second outer edge OP2 in the third direction D3 is between the position of the first outer edge OP1 in the third direction D3 and the center of the semiconductor device 100 in the third direction D3.

In other words, when viewed from the first direction D1, the side of the anode region 4 is positioned more to the inner side than the side of the $n^{++}$ type cathode region 1. The corner portion of the $n^{++}$ type cathode region 1 is positioned more to an inner side than the corner portion of the anode region 4. The same structure as in the semiconductor device 100 is applicable to other structures of the semiconductor device 120.

For example, the first cross section corresponds to the B1-B2 cross section of FIG. 7. The second cross section corresponds to the A1-A2 cross section of FIG. 7. The third cross section corresponds to the C1-C2 cross section of FIG. 7.

According to the second modification example, in the same manner as in the semiconductor device 100 or 110, when the current is interrupted, the likeliness of the breakage of the semiconductor device 120 due to the concentration of the current at the corner portion of the anode region 4 can be reduced.

Third Modification Example

Figure 8:
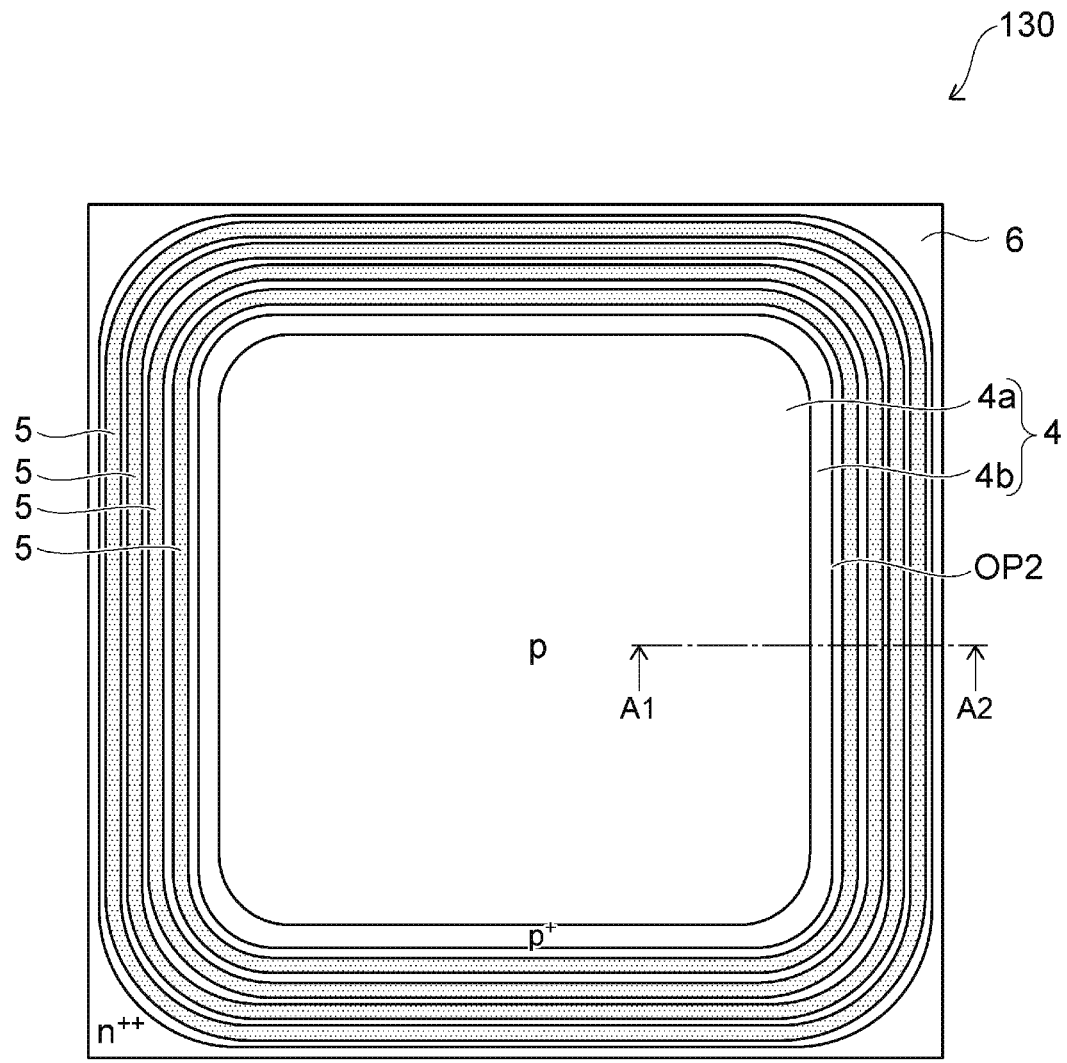
FIG. 8 is a plan view of a semiconductor device according to a third modification example of the first embodiment.
Figure 9:
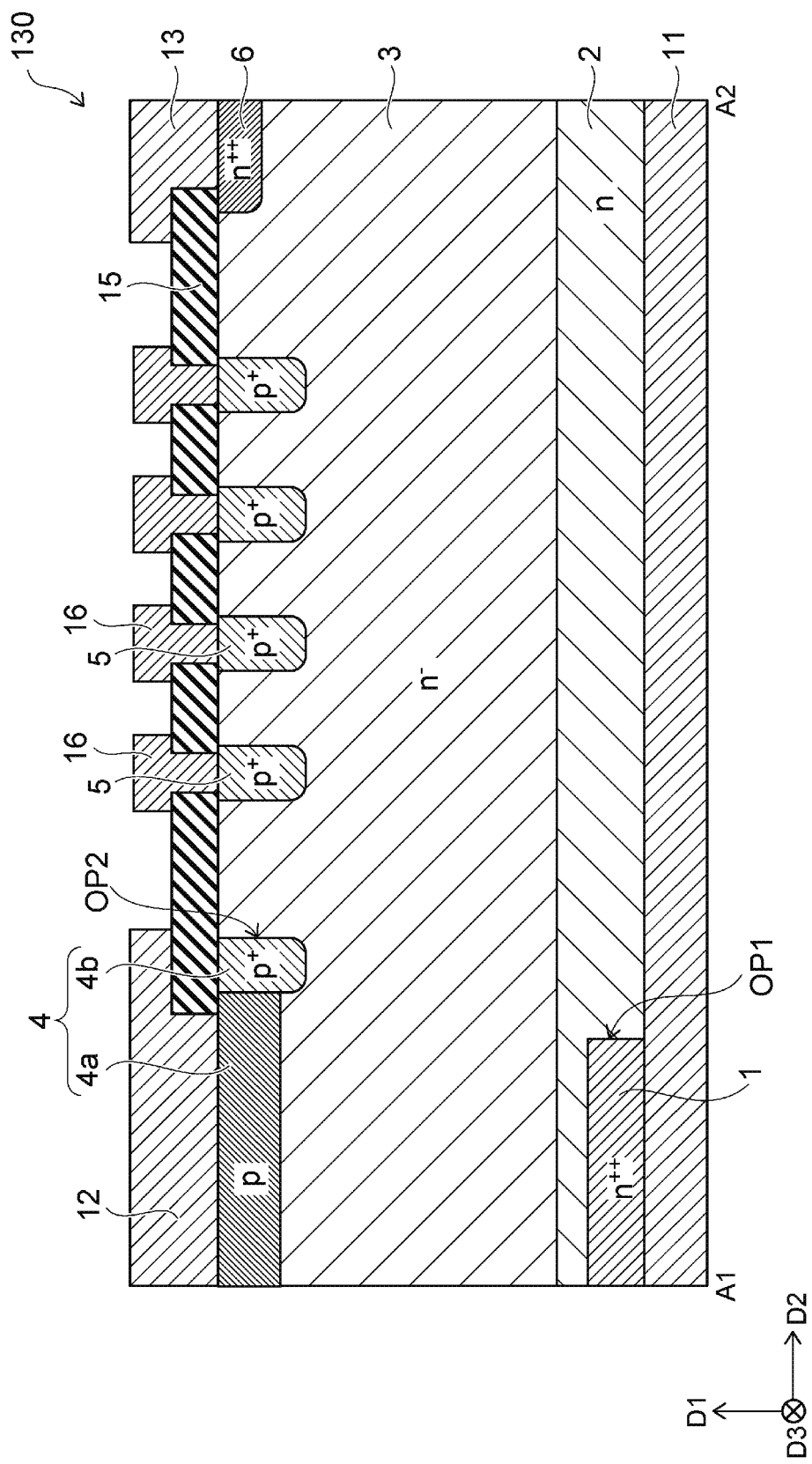
FIG. 9 is a cross sectional view taken along a line A1-A2 in FIG. 8.

FIG. 8 is a plan view of a semiconductor device according to a third modification example of the first embodiment. FIG. 9 is a cross sectional view of the semiconductor device taken along a line A1-A2 in FIG. 8. In FIG. 8, the second electrode 12, a third electrode 13, the insulating layer 15, and a plurality of conductive portions 16 are omitted.

As shown in FIGS. 8 and 9, a semiconductor device 130 according to the third modification example includes a plurality of $p^+$ type guard ring regions 5, an $n^{++}$ type stopper region 6, the third electrode 13, and the plurality of conductive portions 16. The anode region 4 includes a first region 4a and a second region 4b.

The second region 4b is provided around the first region 4a along a plane defined by the second direction D2 and the third direction D3. The p type impurity concentration in the second region 4b is higher than the p type impurity concentration in the first region 4a. The lower end of the second region 4b is positioned on the lower side than the first region 4a.

The $p^+$ type guard ring regions 5 are provided around the anode region 4 along a plane defined by the second direction D2 and the third direction D3. The $p^+$ type guard ring regions 5 are separated from the anode region 4. The p type impurity concentration in the $p^+$ type guard ring region 5 is higher than the p type impurity concentration in the first region 4a. The p type impurity concentration in the $p^+$ type guard ring region 5 may be the same as the p type impurity concentration in the second region 4b and may be different from the p type impurity concentration in the second region 4b. The plurality of $p^+$ type guard ring regions 5 may be provided in the direction from the anode region 4 to the $p^+$ type guard ring regions 5. The plurality of $p^+$ type guard ring regions 5 are separated from each other.

The conductive portions 16 are provided around the second electrode 12 along a plane defined by the second direction D2 and the third direction D3. The conductive portions 16 are separated from the second electrode 12. The conductive portions 16 are positioned on the $p^+$ type guard ring regions 5 and electrically connected to the $p^+$ type guard ring regions 5. For example, the plurality of conductive portions 16 are provided and respectively electrically connected to the plurality of $p^+$ type guard ring regions 5. The plurality of conductive portions 16 are separated from each other.

The $n^{++}$ type stopper region 6 is provided around the $p^+$ type guard ring regions 5 along a plane defined by the second direction D2 and the third direction D3. The $n^{++}$ type stopper region 6 is separated from the $p^+$ type guard ring regions 5. The lower end of the $n^{++}$ type stopper region 6 is positioned on the upper side than the lower ends of the $p^+$ type guard ring regions 5. The n type impurity concentration in the $n^{++}$ type stopper region 6 is higher than the n type impurity concentration in the $n^-$ type drift region 3.

The third electrode 13 is provided around the conductive portions 16 along a plane defined by the second direction D2 and the third direction D3. The third electrode 13 is separated from the conductive portions 16. The third electrode 13 is positioned on the $n^{++}$ type stopper region 6 and is electrically connected to the $n^{++}$ type stopper region 6.

The same structure as in any one of the semiconductor devices 100 to 120 is applicable to other structures of the semiconductor device 130.

For example, in the same manner as the semiconductor device 100 shown in FIG. 3, when viewed from the first direction D1, the first outer edge OP1 of the $n^{++}$ type cathode region 1 may be positioned more to the inner side than the second outer edge OP2 of the anode region 4. In this case, the distance d1 between the first outer edge OP1 and the second outer edge OP2 in the fourth direction D4 in the first cross section is longer than the distance d2 between the first outer edge OP1 and the second outer edge OP2 in the second direction D2 in the second cross section. The distance d1 is longer than the distance d3 between the first outer edge OP1 and the second outer edge OP2 in the third direction D3 in the third cross section.

In the same manner as in the semiconductor device 110 shown in FIG. 6, when viewed from the first direction D1, the first outer edge OP1 of the $n^{++}$ type cathode region 1 may be positioned more to the outer side than the second outer edge OP2 of the anode region 4. In this case, the distance d1 between the first outer edge OP1 and the second outer edge OP2 in the fourth direction D4 in the first cross section is shorter than the distance d2 between the first outer edge OP1 and the second outer edge OP2 in the second direction D2 in the second cross section. The distance d1 is shorter than the distance d3 between the first outer edge OP1 and the second outer edge OP2 in the third direction D3 in the third cross section.

By providing the $p^+$ type guard ring regions 5 and the conductive portions 16, the spreading of the depletion layer to the outer periphery of the $n^-$ type drift region 3 when the semiconductor device 100 goes into an off state is promoted. For example, the concentration of the electric field near the outer periphery of the anode region 4 can be prevented. Accordingly, the breakdown voltage of the semiconductor device 130 can be improved. The semiconductor device 130 has the same structures as in any one of the semiconductor devices 100 to 120. Therefore, when the current flow is interrupted, the likeliness of the breakage of the semiconductor device 130 due to the concentration of the current at the corner portion of the anode region 4 can be reduced.

Fourth Modification Example

Figure 10:
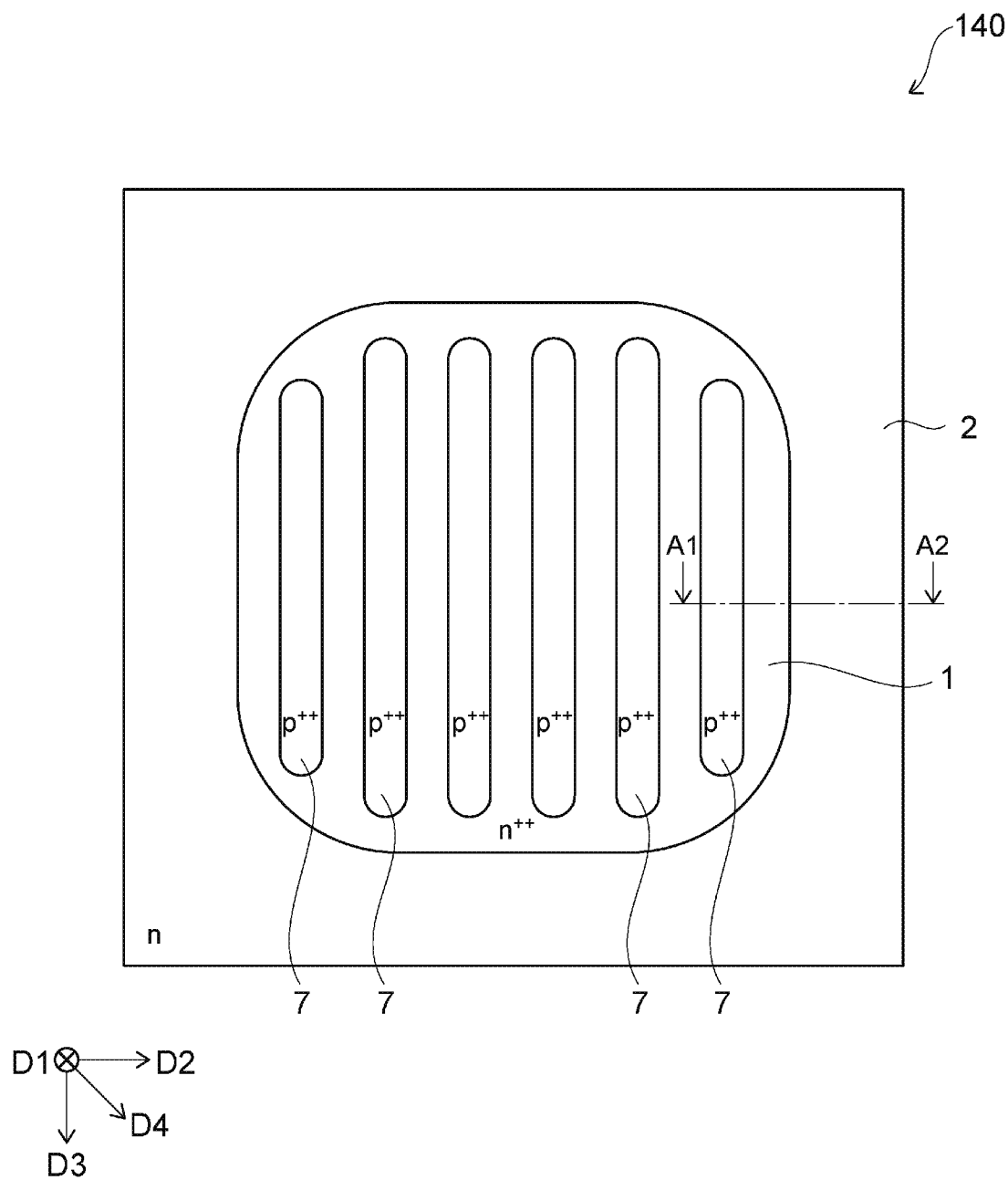
FIG. 10 is a bottom view of a semiconductor device according to a fourth modification example of the first embodiment.
Figure 11:
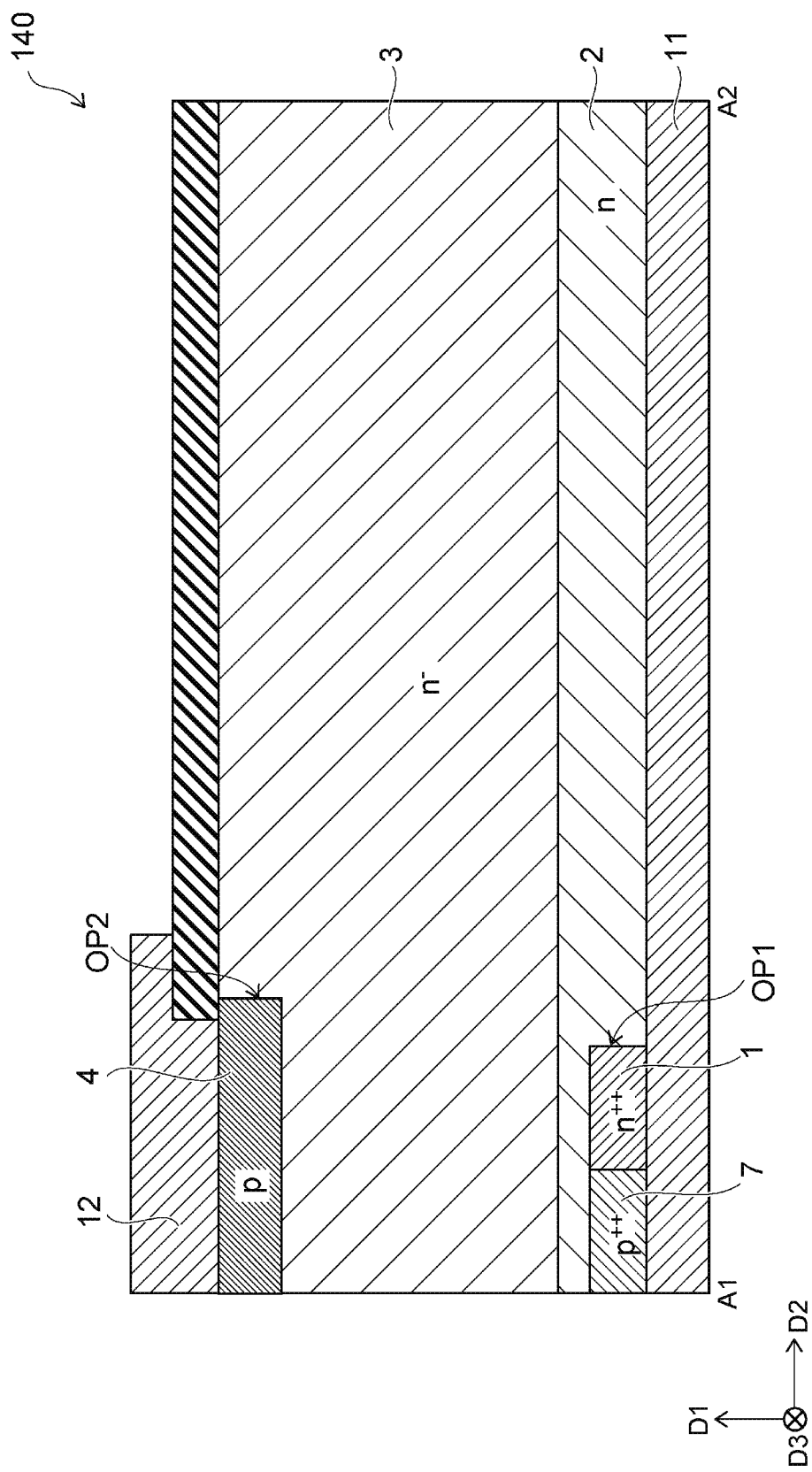
FIG. 11 is a cross sectional view taken along a line A1-A2 in FIG. 10.

FIG. 10 is a bottom view of a semiconductor device according to a fourth modification example of the first embodiment. FIG. 11 is a cross sectional view of the semiconductor device taken along a line A1-A2 in FIG. 10. In FIG. 10, the first electrode 11 is omitted.

As shown in FIGS. 10 and 11, a semiconductor device 140 according to the fourth modification example includes a plurality of $p^{++}$ type semiconductor regions 7 (fifth semiconductor regions).

The $p^{++}$ type semiconductor regions 7 are provided on the first electrode 11 and electrically connected to the first electrode 11. The $p^{++}$ type semiconductor regions 7 are aligned with the $n^{++}$ type cathode region 1 in the perpendicular direction to the first direction D1. The p type impurity concentration in the $p^{++}$ type semiconductor regions 7 is higher than the n type impurity concentration in the n type buffer region 2. For example, the plurality of $p^{++}$ type semiconductor regions 7 are provided in the second direction D2. Each of the $p^{++}$ type semiconductor regions 7 extends in the third direction D3.

If the $p^{++}$ type semiconductor regions 7 are provided, when the semiconductor device 100 turned off, holes are injected from the first electrode 11 to the $n^-$ type drift region 3 via the $p^{++}$ type semiconductor regions 7. Therefore, when being turned off, sharp increase of the voltage difference between the first electrode 11 and the second electrode 12 can be prevented. For example, the vibration of the voltage of the first electrode 11 is prevented, and thus the noise generated by the vibration of the voltage can be reduced.

The same structure as in any one of the semiconductor devices 100 to 120 is applicable to other structures of the semiconductor device 140. Therefore, when the current flow is interrupted, the likeliness of the breakage of the semiconductor device 140 due to the concentration of the current at the corner portion of the anode region 4 can be reduced.

Fifth Modification Example

Figure 12:
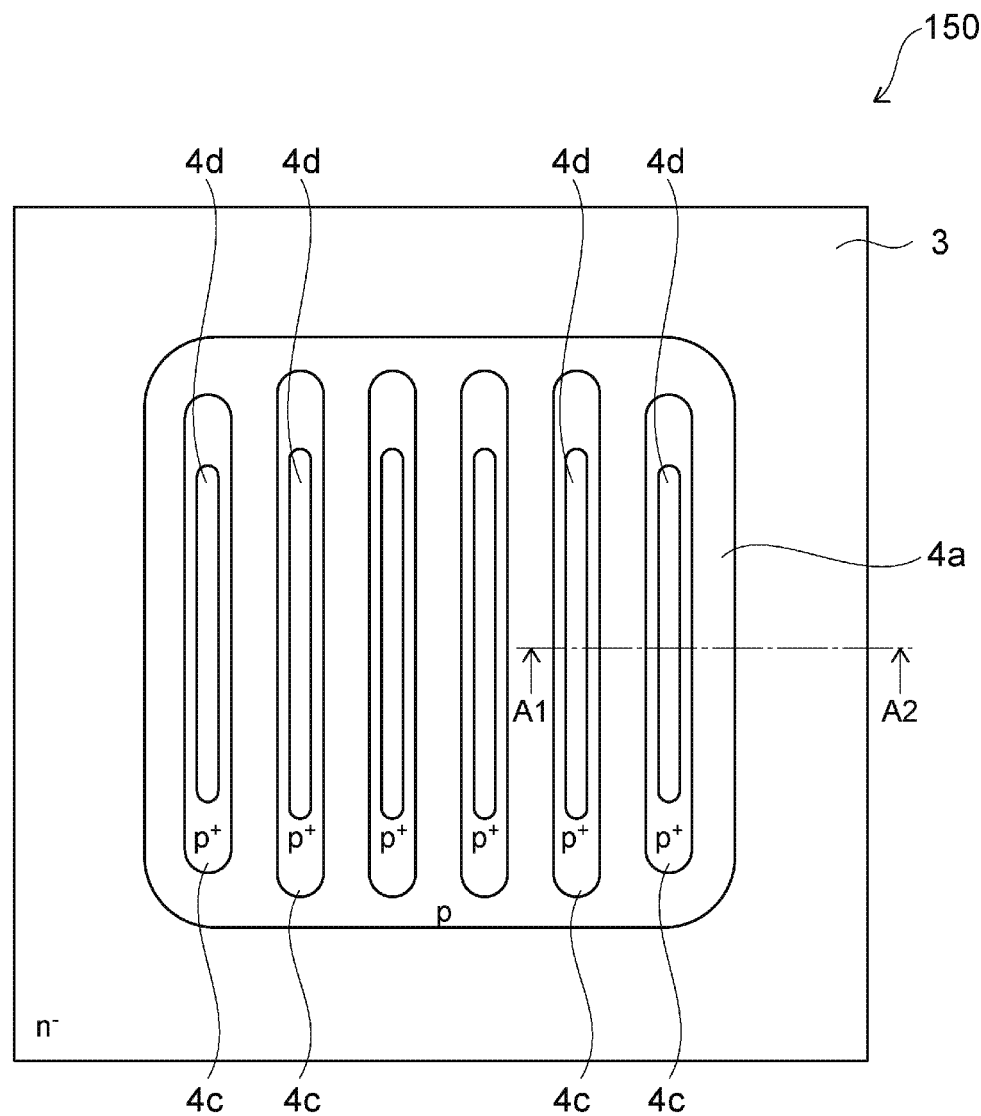
FIG. 12 is a plan view of a semiconductor device according to a fifth modification example of the first embodiment.
Figure 13:
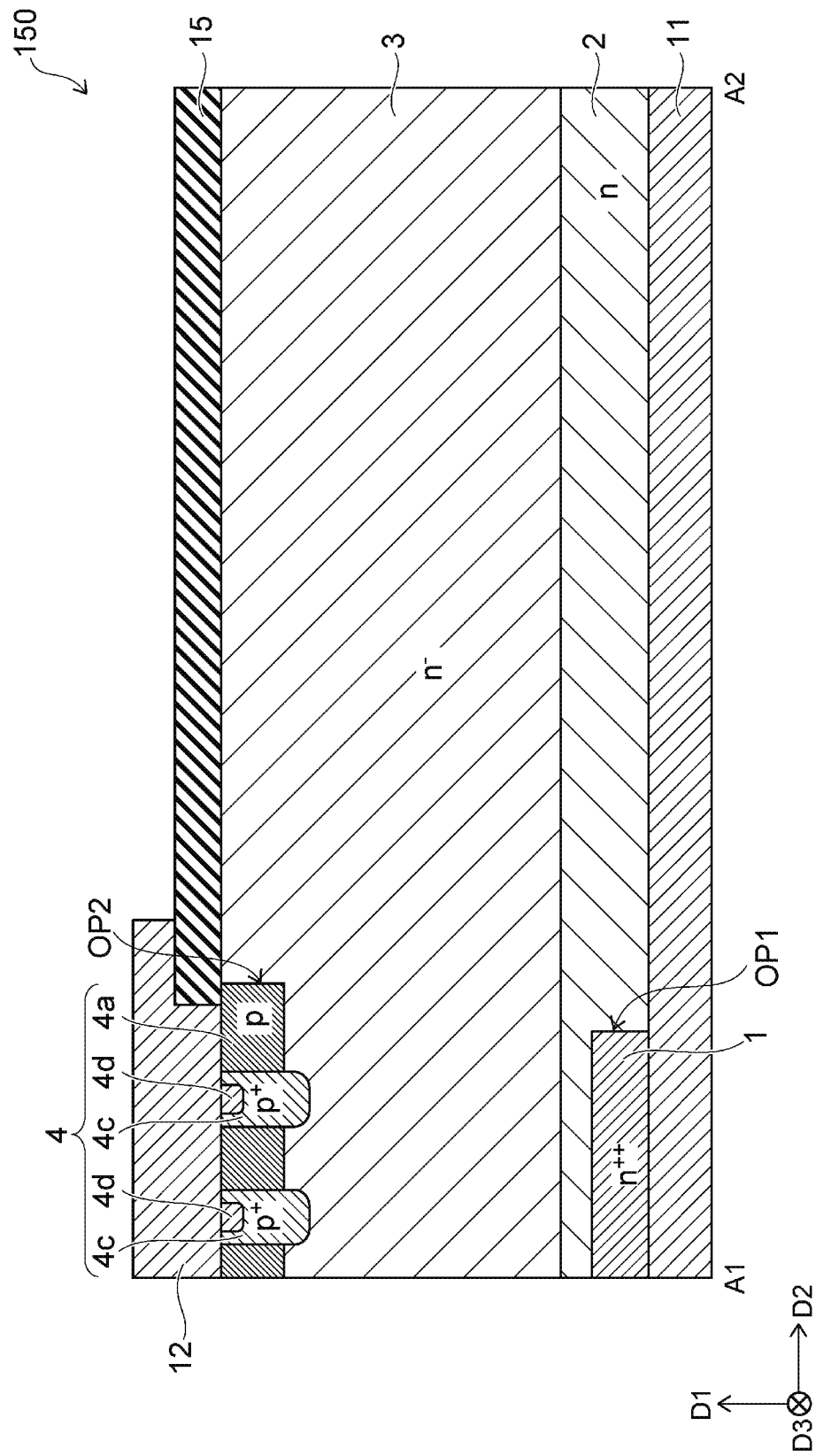
FIG. 13 is a cross sectional view taken along a line A1-A2 in FIG. 12.

FIG. 12 is a plan view of a semiconductor device according to a fifth modification example of the first embodiment. FIG. 13 is a cross sectional view of the semiconductor device taken along a line A1-A2 in FIG. 12. In FIG. 12, the second electrode 12 and the insulating layer 15 are omitted.

In a semiconductor device 150 according to the fifth modification example, the anode region 4 includes the first region 4a and a plurality of third regions 4c.

A portion of the third regions 4c is surrounded by the first region 4a along a plane defined by the second direction D2 and the third direction D3. The lower ends of the third regions 4c are positioned on the lower side than the first region 4a. The lower portions of the third regions 4c are provided in the $n^-$ type drift region 3. The p type impurity concentration of the third regions 4c is higher than the p type impurity concentration in the first region 4a. For example, the plurality of third regions 4c are provided in the second direction D2. Each of the third regions 4c extends in the third direction D3.

Fourth regions 4d are provided in the third regions 4c, respectively. The lower ends of the fourth regions 4d are positioned on the upper side than the lower end of the first region 4a. The p type impurity concentration in the fourth regions 4d is higher than the p type impurity concentration in the third regions 4c.

For example, when the second electrode 12 includes a material with a relatively high work function, the fourth regions 4d are provided for forming an ohmic contact between the anode region 4 and the second electrode 12. For example, the second electrode 12 includes aluminum and silicon. Otherwise, the second electrode 12 includes titanium or tungsten. In these cases, it is desirable that the fourth regions 4d are provided.

By providing the third regions 4c, when the current flow is interrupted by switching the semiconductor device 150 from an on state to an off state, punch-through to the front surface of the anode region 4 is less likely to occur, and the interruption resistance of the semiconductor device 150 is improved.

The same structure as in any one of the semiconductor devices 100 to 120 is applicable to other structures of the semiconductor device 150. Therefore, when the current flow is interrupted, the likeliness of the breakage of the semiconductor device 150 due to the concentration of the current at the corner portion of the anode region 4 can be reduced.

Sixth Modification Example

FIG. 14 is a plan view of a semiconductor device according to a sixth modification example of the first embodiment.

Figure 15:
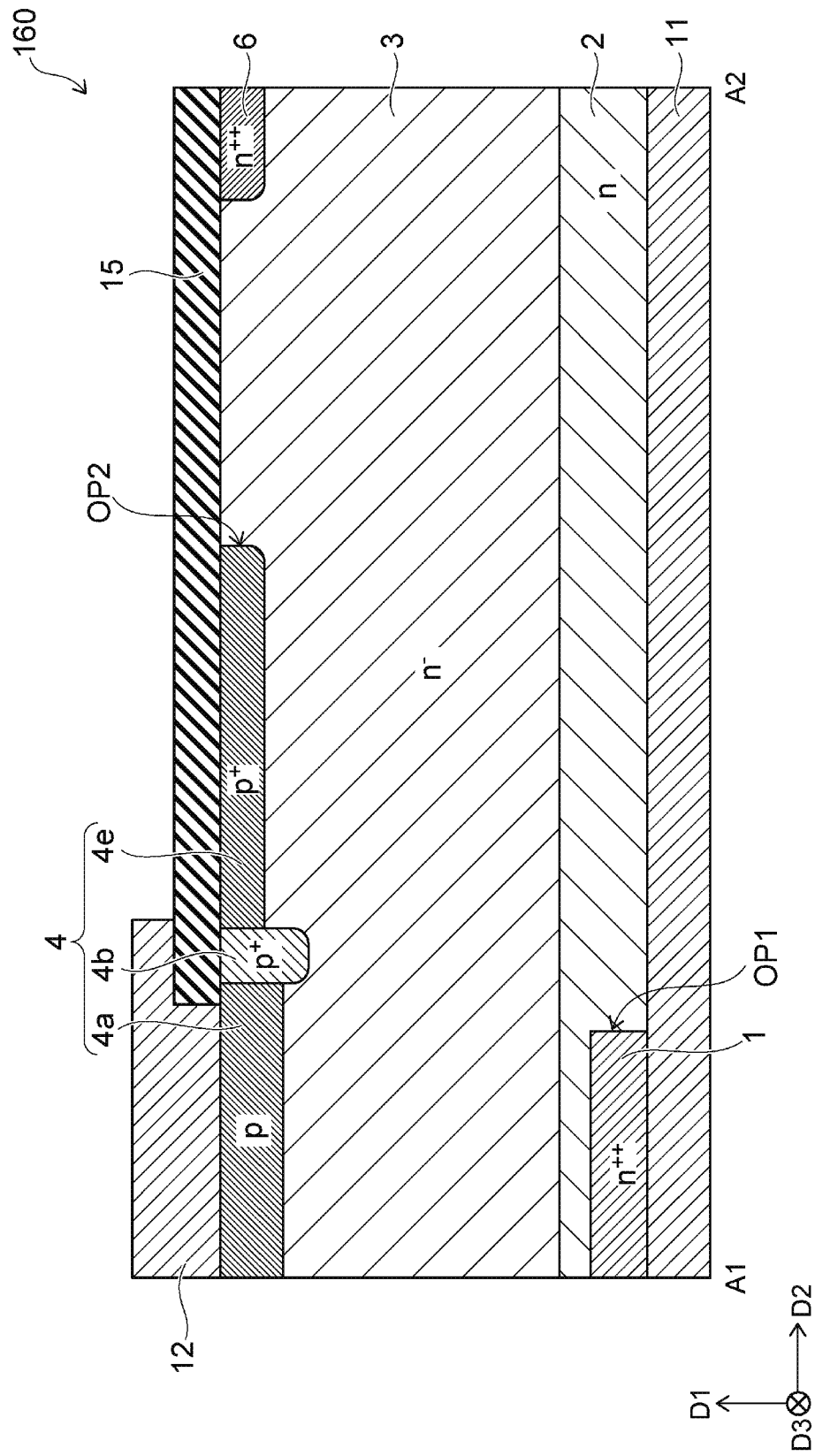
FIG. 15 is a cross sectional view taken along a line A1-A2 in FIG. 14.

FIG. 15 is a cross sectional view of the semiconductor device taken along a line A1-A2 in FIG. 14. In FIG. 14, the second electrode 12 and the insulating layer 15 are omitted.

As shown in FIGS. 14 and 15, in a semiconductor device 160 according to the sixth modification example, the anode region 4 includes the first region 4a, the second region 4b, and a fifth region 4e.

The fifth region 4e is provided around the second region 4b along a plane defined by the second direction D2 and the third direction D3. The lower end of the fifth region 4e is positioned on the upper side than the lower end of the second region 4b. The p type impurity concentration in the fifth region 4e is higher than the p type impurity concentration in the first region 4a. The p type impurity concentration in the fifth region 4e may be the same as the p type impurity concentration in the second region 4b or may be different from the p type impurity concentration in the second region 4b.

By providing the fifth region 4e, similar to a case where the $p^+$ type guard ring regions 5 are provided, the spreading the depletion layer to the outer periphery of the $n^-$ type drift region 3 is promoted. Therefore, the breakdown voltage of the semiconductor device 160 can be improved.

The same structure as in any one of the semiconductor devices 100 to 120 is applicable to other structures of the semiconductor device 160. Therefore, when the current flow is interrupted, the likeliness of the breakage of the semiconductor device 160 due to the concentration of the current at the corner portion of the anode region 4 can be reduced.

Seventh Modification Example

Figure 17:
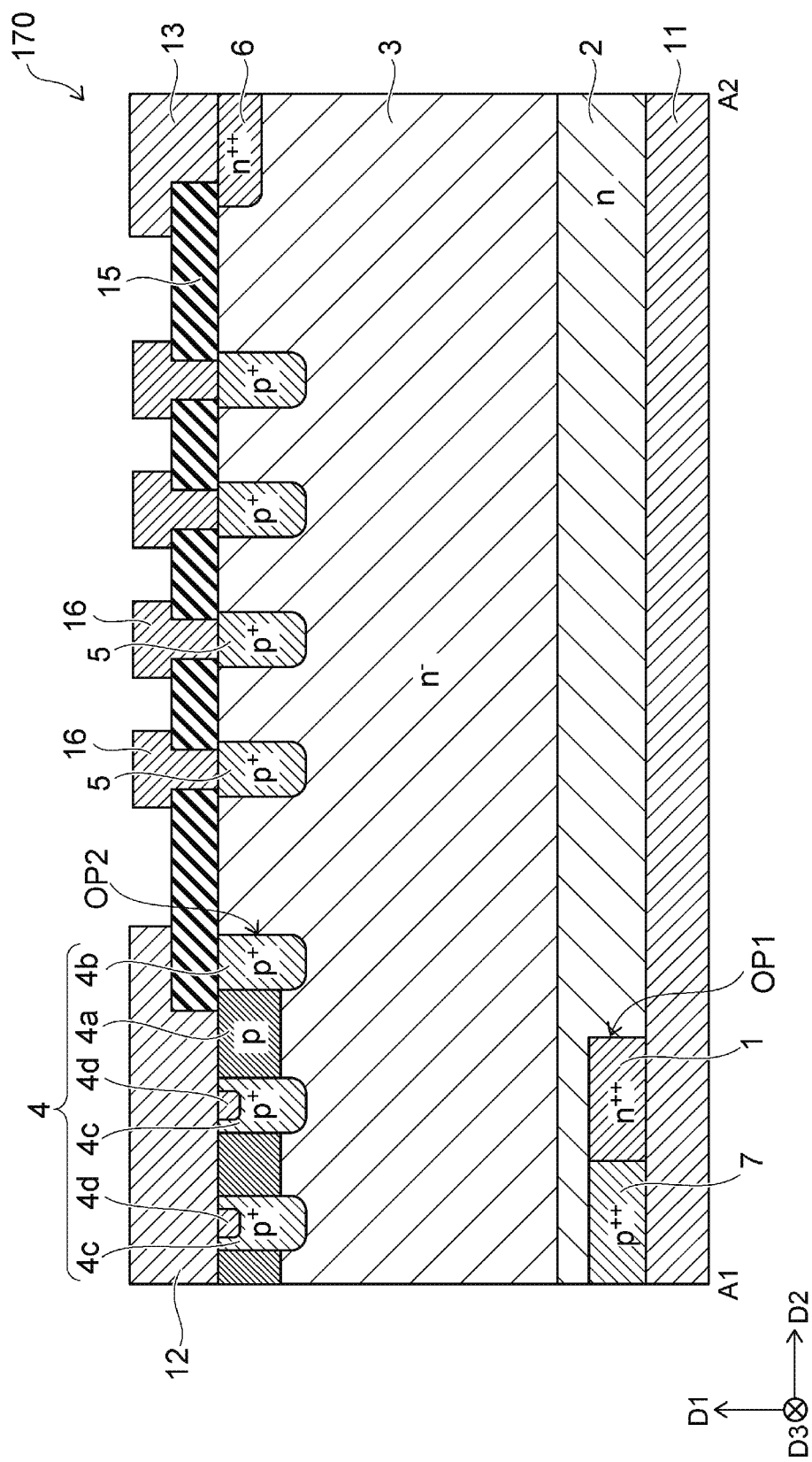
FIG. 17 is a cross sectional view taken along a line A1-A2 in FIG. 16.

FIG. 16 is a plan view of a semiconductor device according to a seventh modification example of the first embodiment. FIG. 17 is a cross sectional view of the semiconductor device taken along a line A1-A2 in FIG. 16. In FIG. 16, the second electrode 12, the third electrode 13, the insulating layer 15, and the conductive portion 16 are omitted.

The structures of the semiconductor devices according to the third to sixth modification examples may be appropriately combined. For example, as shown in FIGS. 16 and 17, a semiconductor device 170 according to the seventh modification example further includes the $p^+$ type guard ring regions 5, the $n^{++}$ type stopper region 6, the $p^{++}$ type semiconductor regions 7, the third electrode 13, and the conductive portions 16 compared with the semiconductor device 100. The anode region 4 includes the first region 4a, the second region 4b, the third regions 4c, and the fourth regions 4d.

Also, when the structures of the semiconductor devices according to each modification example are combined in the same device and the current flow is interrupted, the likeliness of the breakage of the semiconductor device can be reduced by preventing the concentration of the current at the corner portion of the anode region 4.

Second Embodiment

Figure 18:
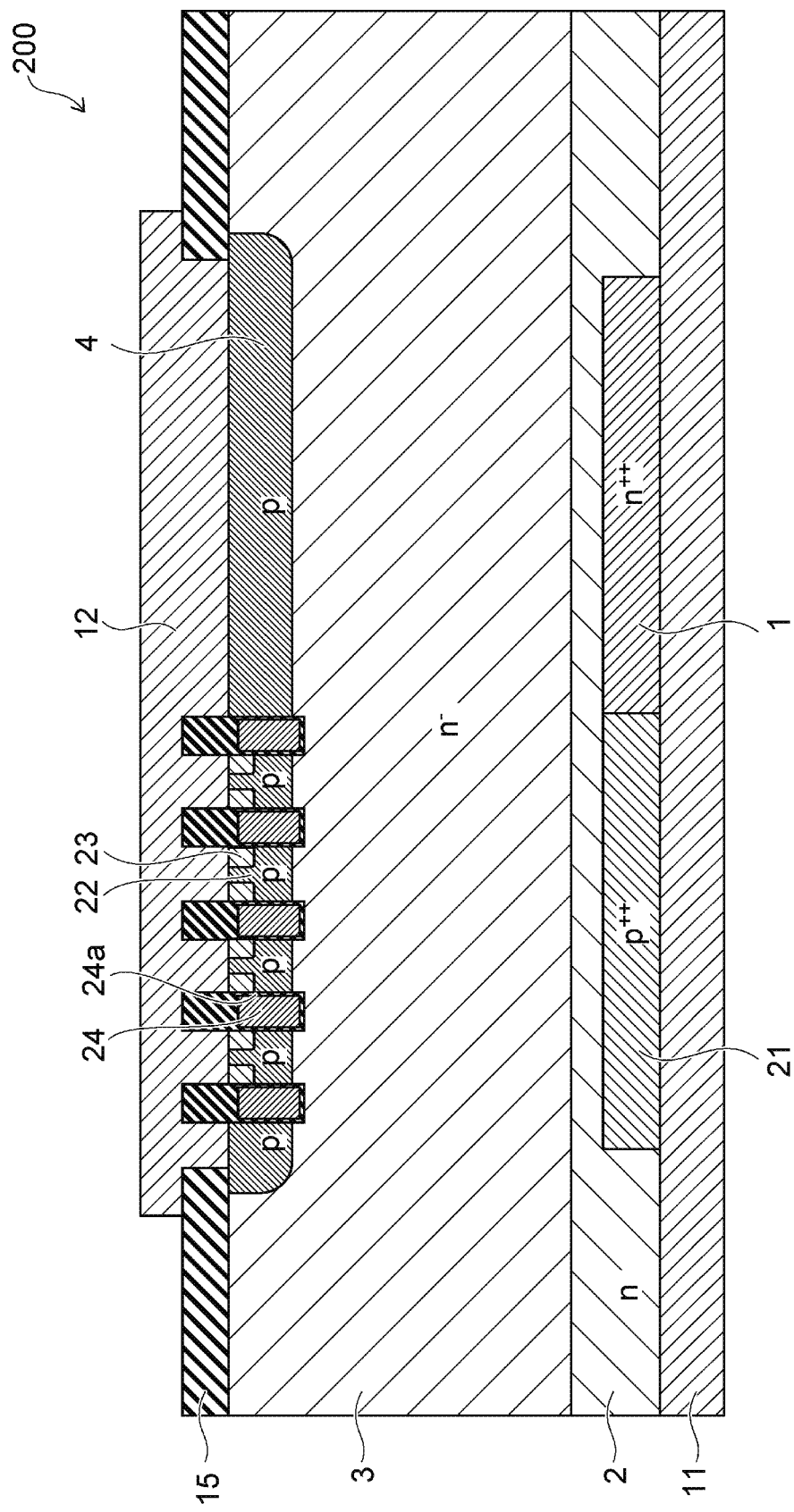
FIG. 18 is a cross sectional view of a semiconductor device according to a second embodiment.

FIG. 18 is a cross sectional view of a semiconductor device according to a second embodiment.

Figure 19:
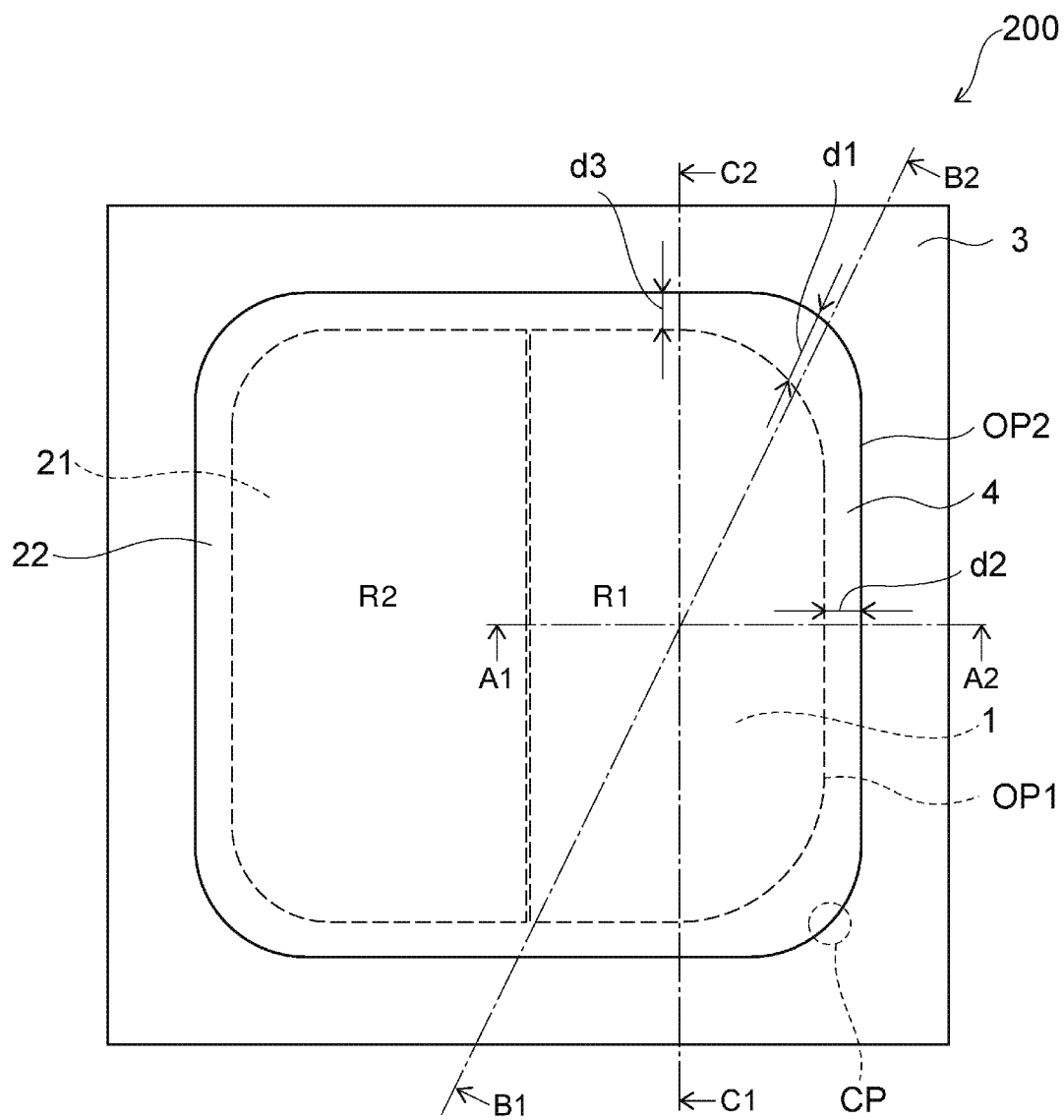
FIG. 19 is a plan view of a semiconductor device according to a second embodiment.

FIG. 19 is a plan view of the semiconductor device according to the second embodiment.

A semiconductor device 200 according to the second embodiment is RC-IGBT (Reverse Conducting Insulated Gate Bipolar Transistor). As shown in FIG. 18, the semiconductor device 200 includes the $n^{++}$ cathode region 1 (the first semiconductor region), the n type buffer region 2 (the second semiconductor region), the $n^-$ type drift region 3 (the third semiconductor region), the anode region 4 (the fourth semiconductor region), the first electrode 11, the second electrode 12, the insulating layer 15, a $p^{++}$ type collector region 21 (a sixth semiconductor region), a p type base regions 22 (a seventh semiconductor region), a plurality of $n^{++}$ type emitter regions 23 (eighth semiconductor regions), and a plurality of gate electrodes 24.

The $n^{++}$ type cathode region 1 and the $p^{++}$ type collector region 21 are provided on the first electrode 11 and electrically connected to the first electrode 11. The $p^{++}$ type collector region 21 is aligned with the $n^{++}$ type cathode region 1 in one direction perpendicular to the first direction D1. In the shown example, the $p^{++}$ type collector region 21 is aligned with the $n^{++}$ type cathode region 1 in the second direction D2.

A portion of the n type buffer region 2 is provided around the $n^{++}$ type cathode region 1 and the $p^{++}$ type collector region 21 along a plane defined by the second direction D2 and the third direction D3. Another portion of the n type buffer region 2 is provided on the $n^{++}$ type cathode region 1 and the $p^{++}$ type collector region 21.

The anode region 4 is provided on the $n^-$ type drift region 3 and is positioned on the $n^{++}$ type cathode region 1. The p type base region 22 is provided on the $n^-$ type drift region 3 and is positioned on the $p^{++}$ type collector region 21. The p type base region 22 is aligned with the anode region 4 in one direction perpendicular to the first direction D1. In the shown example, the p type base region 22 is aligned with the anode region 4 in the second direction D2. The p type base region 22 may be separated from the anode region 4 or may be continuous with the anode region 4.

The $n^{++}$ type emitter region 23 is provided on the p type base region 22. The second electrode 12 is electrically connected to the anode region 4, the p type base region 22, and the $n^{++}$ type emitter region 23. The gate electrode 24 faces the p type base region 22 via a gate insulation layer 24a. In the shown example, the gate electrode 24 faces the p type base region 22 in one direction perpendicular to the first direction D1. The gate electrode 24 is provided on the p type base region 22 and may face the p type base region 22 via the gate insulation layer 24a in the first direction D1. The gate electrode 24 is electrically separated from the second electrode 12.

As shown in FIG. 19, the semiconductor device 200 includes a diode region R1 and an IGBT region R2. FIG. 18 shows a cross section that passes through the diode region R1 and the IGBT region R2 and along the first direction D1 and the second direction D2.

The $n^{++}$ type cathode region 1 and the anode region 4 are provided in the diode region R1. The $p^{++}$ type collector region 21, the p type base region 22, the $n^{++}$ type emitter region 23, and the gate electrode 24 are provided in the IGBT region R2. In the semiconductor device 200, one diode region R1 and one IGBT region R2 are provided.

In the semiconductor device 200, the distance d1 between the first outer edge OP1 and the second outer edge OP2 in the fourth direction D4 in the first cross section is longer than the distance d2 between the first outer edge OP1 and the second outer edge OP2 in the second direction D2 in the second cross section along the first direction D1 and the second direction D2. The distance d1 is longer than the distance d3 between the first outer edge OP1 and the second outer edge OP2 in the third direction D3 in the third cross section.

For example, the first to third cross sections pass through the center of the $n^{++}$ type cathode region 1 in the second direction D2 and the third direction D3. The first cross section passes through the corner portion of the $n^{++}$ type cathode region 1 and along the diagonal line direction of the $n^{++}$ type cathode region 1. The second and third cross sections are along the side direction of the $n^{++}$ type cathode region 1. For example, the first cross section corresponds to the B1-B2 cross section of FIG. 19. The second cross section corresponds to the A1-A2 cross section of FIG. 19. The third cross section corresponds to the C1-C2 cross section of FIG. 19.

According to the second embodiment, in the same manner as in the first embodiment, when the current flow is interrupted, the likeliness of the breakage of the semiconductor device 200 due to the concentration of the current at the corner portion of the anode region 4 can be reduced.

In a similar manner as in the first embodiment, the structure according to any of the first to seventh modification examples is also applicable to the semiconductor device(s) according to the second embodiment. For example, in the semiconductor device according to the second embodiment, in the same manner as in the first modification example of the first embodiment, when viewed from the first direction D1, a portion of the first outer edge OP1 may be positioned more to the outer side than the second outer edge OP2. In this case, the distance d1 between the first outer edge OP1 and the second outer edge OP2 in the fourth direction D4 in the first cross section is shorter than the distance d2 between the first outer edge OP1 and the second outer edge OP2 in the second direction D2 in the second cross section. The distance d1 is shorter than the distance d3 between the first outer edge OP1 and the second outer edge OP2 in the third direction D3 in the third cross section. In any one of the forms, when the current flow is interrupted, the likeliness of the breakage of the semiconductor device due to the concentration of the current at the corner portion of the anode region 4 can be reduced.

The relative level of the impurity concentration between the semiconductor regions in each of the embodiments described above can be calculated by using, for example, a scanning capacitance microscope (SCM). The carrier concentration in each semiconductor region can be regarded as equal to the impurity concentration activated in each semiconductor region. Therefore, the relative height of the carrier concentration between the semiconductor regions can also be calculated by using SCM. The impurity concentration in each semiconductor region can be measured, for example, by secondary ion mass spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
  a semiconductor layer having bottom and upper surfaces opposite to each other in a first direction, the semiconductor layer including:
    a first region of a first conductivity type at the bottom surface;
    a second region of the first conductivity type at the bottom surface surrounding the first region, the second region having a lower impurity concentration of the first conductivity type than the first region;
    a third region of the first conductivity type above the first and second regions, the third region having a lower impurity concentration of the first conductivity type than the second region; and
    a fourth region of a second conductivity type extending from the upper surface into the third region;
  a first electrode on the bottom surface and contacting the first and second regions; and
    a second electrode on the upper surface and contacting the fourth region, wherein
    in a first cross sectional plane along the first direction, an outer edge of the first region is inside an outer edge of the fourth region by a first distance, and
    in a second cross sectional plane along the first direction, an outer edge of the first region is inside an outer edge of the fourth region by a second distance less than the first distance.

2. The semiconductor device according to claim 1, wherein
  the semiconductor device has a rectangular shape in a second direction perpendicular to the first direction and a third direction perpendicular to the first and second directions,
  the first cross sectional plane includes a diagonal line of the rectangular shape, and
  the second cross sectional plane includes a center line of the rectangular shape extending in the second direction.

3. The semiconductor device according to claim 2, wherein a difference of the first distance and the second distance is in a range of 50 μm to 200 μm.

4. The semiconductor device according to claim 2, wherein a ratio of the first distance divided by the second distance is in a range of 1.1 to 200.

5. The semiconductor device according to claim 2, wherein the semiconductor layer further includes a plurality of fifth regions of the second conductivity type arranged in the second direction in the first region, each of the fifth regions extending in the third direction.

6. The semiconductor device according to claim 2, wherein
  the semiconductor layer further includes:
    a sixth region of the second conductivity type adjacent to the first region in the second direction and contacting the first electrode;
    a seventh region of the second conductivity type extending from the upper surface into the third region above the sixth region and contacting the second electrode; and
    a plurality of eighth regions of the first conductivity type extending from the upper surface into the seventh region and contacting the second electrode, and
  the semiconductor device further comprises a plurality of gate electrodes extending in the seventh region.

7. The semiconductor device according to claim 2, wherein the fourth region includes a first sub region and a second sub region that has a higher impurity concentration of the second conductivity type than the first sub region and extends towards the first electrode than the first sub region.

8. The semiconductor device according to claim 2, wherein in a third cross sectional plane including a center line of the rectangular shape extending in the third direction, an outer edge of the first region is inside an outer edge of the fourth region by a third distance less than the first distance.

9. A semiconductor device, comprising:
- a semiconductor layer having bottom and upper surfaces opposite to each other in a first direction, the semiconductor layer including:
  - a first region of a first conductivity type at the bottom surface;
  - a second region of the first conductivity type at the bottom surface surrounding the first region, the second region having a lower impurity concentration of the first conductivity type than the first region;
  - a third region of the first conductivity type above the first and second regions, the third region having a lower impurity concentration of the first conductivity type than the second region; and
  - a fourth region of a second conductivity type extending from the upper surface into the third region;
- a first electrode on the bottom surface and contacting the first and second regions; and
  - a second electrode on the upper surface and contacting the fourth region, wherein
  - in a first cross sectional plane along the first direction, an outer edge of the fourth region is inside an outer edge of the first region by a first distance, and
  - in a second cross sectional plane along the first direction, an outer edge of the fourth region is inside an outer edge of the first region by a second distance greater than the first distance.

10. The semiconductor device according to claim 9, wherein
- the semiconductor device has a rectangular shape in a second direction perpendicular to the first direction and a third direction perpendicular to the first and second directions,
- the first cross sectional plane includes a diagonal line of the rectangular shape, and
- the second cross sectional plane includes a center line of the rectangular shape extending in the second direction.

11. The semiconductor device according to claim 10, wherein a difference of the first distance and the second distance is in a range of 50 µm to 200 µm.

12. The semiconductor device according to claim 10, wherein a ratio of the second distance divided by the first distance is in a range of 1.1 to 200.

13. The semiconductor device according to claim 10, wherein the semiconductor layer further includes a plurality of fifth regions of the second conductivity type arranged in the second direction in the first region, each of the fifth regions extending in the third direction.

14. The semiconductor device according to claim 10, wherein
- the semiconductor layer further includes:
  - a sixth region of the second conductivity type adjacent to the first region in the second direction and contacting the first electrode;
  - a seventh region of the second conductivity type extending from the upper surface into the third region above the sixth region and contacting the second electrode; and
  - a plurality of eighth regions of the first conductivity type extending from the upper surface into the seventh region and contacting the second electrode, and
- the semiconductor device further comprises a plurality of gate electrodes extending in the seventh region.

15. The semiconductor device according to claim 10, wherein the fourth region includes a first sub region and a second sub region that has a higher impurity concentration of the second conductivity type than the first sub region and extends towards the first electrode than the first sub region.

16. The semiconductor device according to claim 10, wherein in a third cross sectional plane including a center line of the rectangular shape extending in the third direction, an outer edge of the fourth region is inside an outer edge of the first region by a third distance greater than the first distance.

17. A semiconductor device, comprising:
- a semiconductor layer having bottom and upper surfaces opposite to each other in a first direction, the semiconductor layer including:
  - a first region of a first conductivity type at the bottom surface;
  - a second region of the first conductivity type at the bottom surface surrounding the first region, the second region having a lower impurity concentration of the first conductivity type than the first region;
  - a third region of the first conductivity type above the first and second regions, the third region having a lower impurity concentration of the first conductivity type than the second region; and
  - a fourth region of a second conductivity type extending from the upper surface into the third region;
- a first electrode on the bottom surface and contacting the first and second regions; and
- a second electrode on the upper surface and contacting the fourth region, wherein
  - in a first cross sectional plane along the first direction, an outer edge of the first region is inside an outer edge of the fourth region, and
  - in a second cross sectional plane along the first direction, an outer edge of the fourth region is inside an outer edge of the first region.

18. The semiconductor device according to claim 17, wherein
- the semiconductor device has a rectangular shape in a second direction perpendicular to the first direction and a third direction perpendicular to the first and second directions,
- the first cross sectional plane includes a diagonal line of the rectangular shape, and
- the second cross sectional plane includes a center line of the rectangular shape extending in the second direction.

19. The semiconductor device according to claim 18, wherein the semiconductor layer further includes a plurality of fifth regions of the second conductivity type arranged in the second direction in the first region, each of the fifth regions extending in the third direction.

20. The semiconductor device according to claim 18, wherein
- the semiconductor layer further includes:
  - a sixth region of the second conductivity type adjacent to the first region in the second direction and contacting the first electrode;
  - a seventh region of the second conductivity type extending from the upper surface into the third region above the sixth region and contacting the second electrode; and
  - a plurality of eighth regions of the first conductivity type extending from the upper surface into the seventh region and contacting the second electrode, and
- the semiconductor device further comprises a plurality of gate electrodes extending in the seventh region.

* * * * *